(12) United States Patent
Hitomi

(10) Patent No.: US 11,227,808 B2
(45) Date of Patent: Jan. 18, 2022

(54) POWER MODULE AND METHOD FOR FABRICATING THE SAME, AND POWER CONVERSION DEVICE

(71) Applicant: Mitsubishi Electric Corporation, Chiyoda-ku (JP)

(72) Inventor: Haruko Hitomi, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/633,947

(22) PCT Filed: Mar. 6, 2018

(86) PCT No.: PCT/JP2018/008611
§ 371 (c)(1),
(2) Date: Jan. 24, 2020

(87) PCT Pub. No.: WO2019/049400
PCT Pub. Date: Mar. 14, 2019

(65) Prior Publication Data
US 2020/0219782 A1    Jul. 9, 2020

(30) Foreign Application Priority Data

Sep. 5, 2017   (JP) .............................. JP2017-170330

(51) Int. Cl.
*H01L 23/31* (2006.01)
*H01L 21/48* (2006.01)
(Continued)

(52) U.S. Cl.
CPC ...... *H01L 23/3121* (2013.01); *H01L 21/4817* (2013.01); *H01L 21/4853* (2013.01);
(Continued)

(58) Field of Classification Search
CPC ............ H01L 23/3121; H01L 23/3675; H01L 2224/48091; H01L 2924/15787;
(Continued)

(56) References Cited

U.S. PATENT DOCUMENTS 5,606,200 A   2/1997  Haraguchi et al.
2003/0011057 A1*  1/2003  Nakajima ............... H01L 24/48
                                                     257/678

FOREIGN PATENT DOCUMENTS

JP           6-268102 A      9/1994
WO     WO 2015/152373 A1    10/2015

OTHER PUBLICATIONS

International Search Report dated May 22, 2018 in PCT/JP2018/008611 filed Mar. 6, 2018, 1 page.

* cited by examiner

*Primary Examiner* — Jasmine J Clark
(74) *Attorney, Agent, or Firm* — Xsensus LLP

(57) ABSTRACT

A power module which inhibits disjoin between a sealing resin and an adhesive. The power module includes: an insulative substrate having a semiconductor element mounted on the top surface; a base plate joined to the rear surface of the insulative substrate; a case member with the base plate, that surrounds the insulative substrate, the case member having a bottom surface whose inner periphery portion side being in contact with a top surface of the base plate, the bottom surface being provided with an angled surface whose distance to the top surface of the base plate increases toward an outer periphery side of the base plate; an adhesive member filled between the base plate and the angled surface to adhere the base plate and the case member; and a filling member filled in a region bounded by the base plate and the case member.

10 Claims, 13 Drawing Sheets

(51) Int. Cl.
*H01L 21/56* (2006.01)
*H01L 23/367* (2006.01)
*H01L 23/00* (2006.01)
*H01L 25/07* (2006.01)
*H01L 25/18* (2006.01)
*H02M 7/00* (2006.01)
*H05K 1/02* (2006.01)
*H05K 5/02* (2006.01)
*H05K 5/06* (2006.01)
*H05K 7/14* (2006.01)

(52) U.S. Cl.
CPC ........ *H01L 21/565* (2013.01); *H01L 23/3675* (2013.01); *H01L 24/32* (2013.01); *H01L 24/48* (2013.01); *H01L 24/73* (2013.01); *H01L 24/83* (2013.01); *H01L 25/072* (2013.01); *H01L 25/18* (2013.01); *H02M 7/003* (2013.01); *H05K 1/0271* (2013.01); *H05K 5/0217* (2013.01); *H05K 5/064* (2013.01); *H05K 7/1427* (2013.01); *H01L 2224/32225* (2013.01); *H01L 2224/48091* (2013.01); *H01L 2224/48106* (2013.01); *H01L 2224/48177* (2013.01); *H01L 2224/73265* (2013.01); *H01L 2924/10272* (2013.01); *H01L 2924/35121* (2013.01)

(58) Field of Classification Search
CPC ........... H01L 2924/181; H01L 23/3735; H01L 24/48; H01L 25/18; H01L 24/73; H01L 24/83; H01L 24/32; H01L 25/072; H01L 2224/32225; H01L 21/565; H01L 21/4817; H05K 1/0271; H05K 5/0217; H05K 5/064; H05K 7/1427; H02M 7/003
See application file for complete search history.

POWER MODULE AND METHOD FOR FABRICATING THE SAME, AND POWER CONVERSION DEVICE

TECHNICAL FIELD

The present invention relates to a power module and a method for fabricating the same, and a power conversion device which includes the power module.

BACKGROUND ART

In general, power modules are used under various environment, according to applications in which they are used. Various materials comprising a power module have different coefficients of linear expansion. Thus, due to thermal stress resulting from the difference in coefficient of linear expansion, the materials may be disjoined from one another. If they are disjoined, the insulation tolerance of the power module may degrade.

Moreover, in order to meet the further requirements for power modules, there is a need for an increased number of cycles in the heat cycle test, and improved reliability corresponding to an expansion of the use temperature range (an increase in temperature).

A conventional power module is disclosed in which a case and a base plate are adhered by an adhesive, and the case is sealed with a filling member (e.g., PTL 1).

CITATION LIST

Patent Literature

PTL 1: WO2015/152373 (page 4, FIG. 1)

SUMMARY OF INVENTION

Technical Problem

However, in conventional power modules, if an epoxy resin is used as the filling member, there is a great difference in coefficient of linear expansion between the filling member and a silicone adhesive used to adhere the case and the base plate. Moreover, silicone and epoxy are hardly compatible with each other. Consequently, due to a thermal stress, such as a temperature cycle, the interface between the adhesive and the filling member may become a location from which disjoining between the two originates.

The present invention is made to solve the problem as described above, and an object of the present invention is to provide a power module in which a filling member and an adhesive are inhibited from being disjoined.

Solution to Problem

A power module according to the present invention includes: an insulative substrate having a semiconductor element joined to a top surface; a base plate joined to a rear surface of the insulative substrate; a case member with the base plate, that surrounds the insulative substrate, the case member having a bottom surface whose inner periphery portion side being in contact with a top surface of the base plate, the bottom surface being provided with an angled surface whose distance to the top surface of the base plate increases toward an outer periphery side of the base plate; an adhesive member filled between the base plate and the angled surface to adhere the base plate and the case member; and a filling member filled in a region bounded by the base plate and the case member.

Advantageous Effects of Invention

According to the present invention, the bottom surface of the case member is provided with the angled surface, and the case member is disposed so that the inner periphery portion side of the bottom surface of the case member is in contact with the base plate, thereby inhibiting the filling member and the adhesive from being disjoined.

DESCRIPTION OF EMBODIMENTS

Initially, an overall configuration of a power module according to the present invention will be described, with reference to the accompanying drawings. Note that drawings are schematic representation and do not scale. Moreover, the same reference sign refers to the same or corresponding parts, which applies throughout this specification.

Embodiment 1

Figure 1:
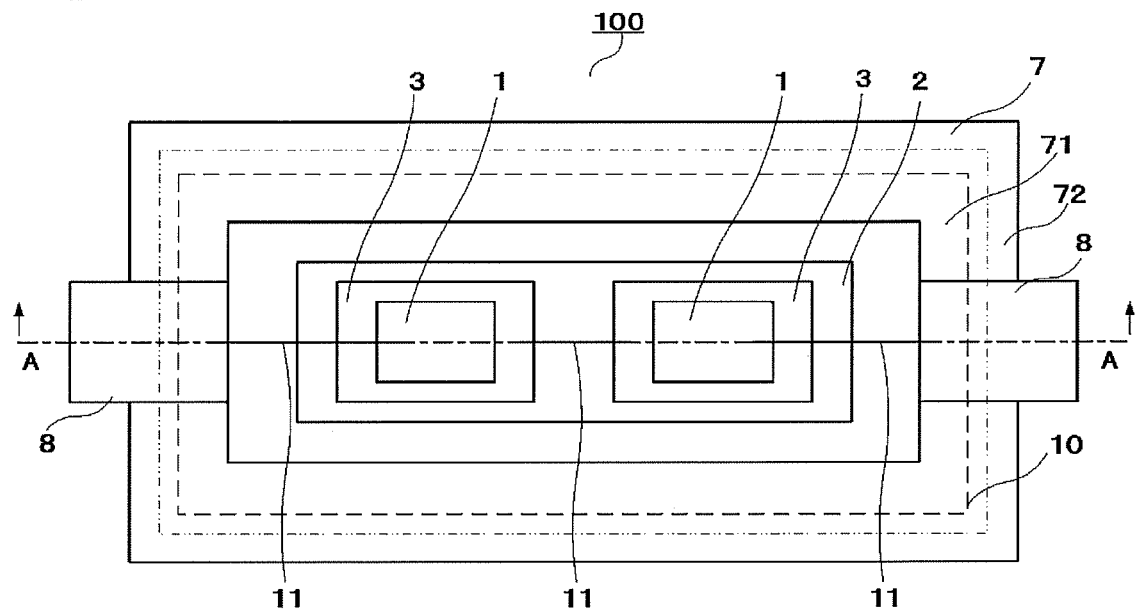
FIG. 1 is a planar structural diagram of a power module according to Embodiment 1 of the present invention.
Figure 2:
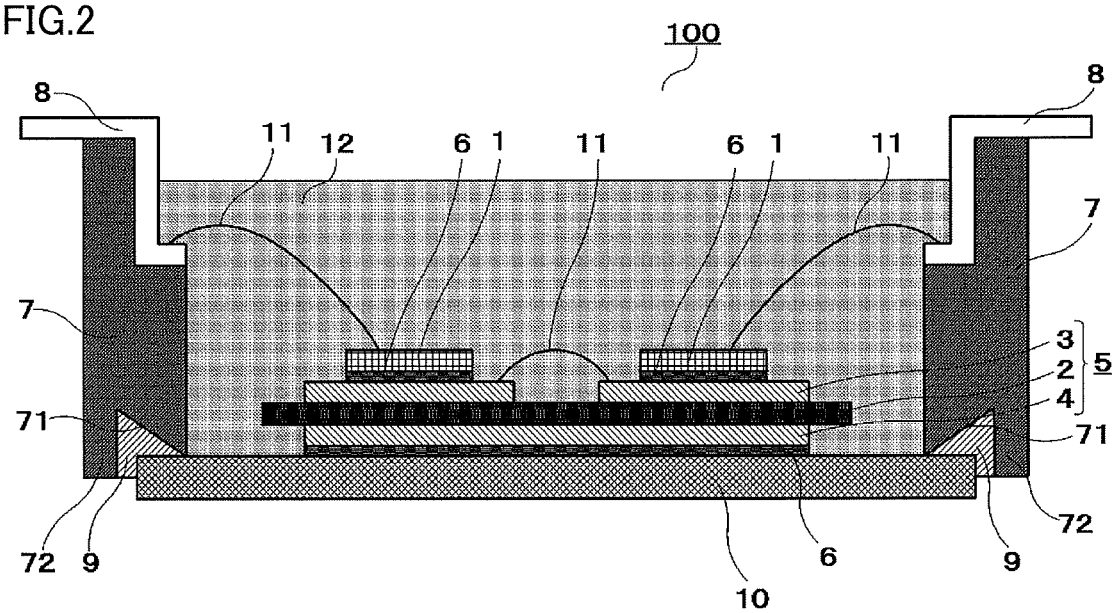
FIG. 2 is a cross-sectional structural diagram of the power module according to Embodiment 1 of the present invention.

FIG. 1 is a planar structural diagram of a power module according to Embodiment 1 of the present invention. FIG. 2 is a cross-sectional structural diagram of the power module according to Embodiment 1 of the present invention. The cross-sectional structural diagram taken along the dotted line AA in FIG. 1 is shown in FIG. 2. In the figure, a power module 100 includes semiconductor elements 1, an insulative substrate 5, joining materials 6, a case member 7, an electrode terminal 8, an adhesive 9 which is an adhesive member, a base plate 10, bonding wires 11 which are line members, and a filling member 12. Case member 7 includes an angled surface 71 and a protrusion 72.

In the following, a surface on the insulative substrate 5 is disposed will be referred to as a top surface of base plate 10, a surface corresponding to the bottom surface of power module 100 will be referred to as a rear surface, and the outer periphery will be referred to as a side surface. Regarding the other members, unless otherwise specified, surfaces of the members closer to the bottom surface of power module 100 will be referred to as rear surfaces of the members, and surfaces of the members opposite the rear surfaces, that is, surfaces on the semiconductor element 1 side will be referred to as top surfaces of the members, and the outer peripheries of the members will be referred to as side surfaces of the members. Similarly, as used herein, an outer periphery, outer periphery side, and outer periphery portion side refer to the outer periphery, outer periphery side, and outer periphery portion side of power module 100, and an inner periphery, inner periphery side, and inner periphery portion side refer to the inner periphery, inner periphery side, and inner periphery portion side of power module 100 which is filled with filling member 12.

In FIG. 1, a portion of case member 7 between the inner periphery of case member 7 and the two-dot chain line is angled surface 71 of case member 7. Moreover, the dotted line indicates the outer periphery of base plate 10. Furthermore, a portion of case member 7 between the two-dot chain line and the outer periphery of case member 7 is protrusion 72 of case member 7. Here, angled surface 71 is formed across the inner periphery portion side of the bottom surface of case member 7. The tip of angled surface 71 of the bottom surface of case member 7 is in contact with the top surface of base plate 10. However, within a range in which the reliability of power module 100 is secured, a region may be provided in which the tip of angled surface 71 of the bottom surface of case member 71 is not in contact with the top surface of base plate 10.

In FIG. 2, insulative substrate 5 includes a ceramic plate 2, which is an insulating member, and metal layers 3, 4 which are formed on the top and rear surfaces of ceramic plate 2. Silicon nitride ($Si_3N_4$), aluminum nitride (AlN), aluminum oxide (AlO: alumina), and Zr-containing alumina can be used as ceramic plate 2. In particular, from the standpoint of thermal conductivity, AlN and $Si_3N_4$ are preferable, and, from the standpoint of material strength, $Si_3N_4$ is more preferable. An epoxy resin, etc. may be used as the insulative substrate.

Metals having the same dimension (size) and the same thickness are used for metal layers 3, 4 formed on opposite surfaces (the top surface, the rear surface) of ceramic plate 2. However, electric circuits are formed on respective metal layers 3, 4, and thus metal layers 3, 4 may have different pattern shapes. Moreover, the sizes of metal layers 3, 4 are smaller than ceramic plate 2. Metal layers 3, 4 being smaller in size than ceramic plate 2 can extend the creepage distance between metal layers 3, 4, securing the electrically insulating properties between metal layers 3, 4. Furthermore, metal layer 4 being smaller in size than ceramic plate 2 allows filling member 12 to move into the space below the ceramic plate 2. Metals having excellent electrical conductivity and thermal conductivity, for example, aluminum and aluminum alloy, or copper and copper alloy may be used for metal layers 3, 4. In particular, from the standpoint of thermal conductivity and electrical conductivity, copper is preferable.

Semiconductor elements 1 are mounted on metal layers 3 on the top surface of ceramic plate 2. Semiconductor element 1 is electrically joined to metal layer 3 on the top surface of ceramic plate 2 via joining material 6 which is, for example, a solder. For example, a power control semiconductor element (switching element) which controls a large current, such as MOSFET (Metal Oxide Semiconductor Field Effect Transistor), IGBT (Insulated Gate Bipolar Transistor), etc., or a wheeling diode is used as semiconductor element 1.

For example, besides silicon (Si), silicon carbide (SiC), which is a wide band gap semiconductor, can be used as a material from which semiconductor element 1 is formed. These are used as a substrate material to form a Si semiconductor element or a SiC semiconductor element. Examples of the wide band gap semiconductor include gallium nitride (GaN)-based materials or diamond. If the wide band gap semiconductor is used, semiconductor element 1 have a high allowable current density and low power loss, thereby allowing size reduction of power module 100 and the like which use a power semiconductor element.

Compared to the Si semiconductor element, the SiC semiconductor element is formed of a very hard material. Thus, preferably, the SiC semiconductor element has a thickness of 0.08 to 0.2 mm. This is because it takes time and cost to grind a very hard SiC wafer to obtain a SiC semiconductor element having a thickness of less than 0.08 mm. If the thickness of the SiC semiconductor element is greater than 0.2 mm, heat dissipation of the SiC semiconductor element is lowered, increasing thermal stress at the interface between the SiC semiconductor element and the filling member. Thus, the thickness of the SiC semiconductor element may be in the range from 0.08 to 0.2 mm.

Typically, joining material 6, which is a solder, is used to join metal layer 3 on the top surface of insulative substrate 5 and semiconductor element 1. However, joining material 6 is not limited to solders. Besides solders, for example, sintered silver, conductive adhesives, and liquid-phase diffusing materials can be applied. Compared to solder materials, sintered silver or a liquid-phase diffusing material has a high melting temperature and does not re-melt when joining metal layer 4 on the rear surface of insulative substrate 5 and base plate 10, and thus improve bonding reliability between semiconductor element 1 and insulative substrate 5.

Furthermore, since sintered silver or a liquid-phase diffusing material has a higher melting temperature than solder, the operating temperature of power module 100 can be increased. Sintered silver has better thermal conductivity than solder, and thus improves heat dissipation of semiconductor element 1, improving the reliability of power module 100. A liquid-phase diffusing material allows semiconductor element 1 to be joined with a less load than sintered silver, and thus has good processibility and can prevent damage to semiconductor element 1 caused by the bonding load.

Base plate 10 is joined to metal layer 4 on the rear surface of insulative substrate 5 via joining material 6 such as a solder. Base plate 10 becomes the bottom plate of power module 100, forming a region bounded by base plate 10 and case member 7 disposed around base plate 10. For example, copper or aluminum is used as a material of base plate 10.

For example, a solder can be used as a joining material 6 which is used to join metal layer 4 on the rear surface of insulative substrate 5 and base plate 10. From the standpoint of bonding reliability, a solder material having a Sn—Sb composition system is preferable as the solder. As with joining of metal layer 3 on the top surface of insulative substrate 5 and semiconductor element 1, sintered silver and a liquid-phase diffusing material can be applied to join metal layer 4 on the rear surface of insulative substrate 5 and base plate 10, besides the solder.

Here, the electrically insulation may also be provided by an insulating sheet, rather than insulative substrate 5. In this case, for example, the insulating sheet is directly attached to base plate 10, and metal layer 3 having a line pattern formed therein and semiconductor element 1 are joined and stacked on the insulating sheet in the listed order by a solder or the like.

Figure 3:
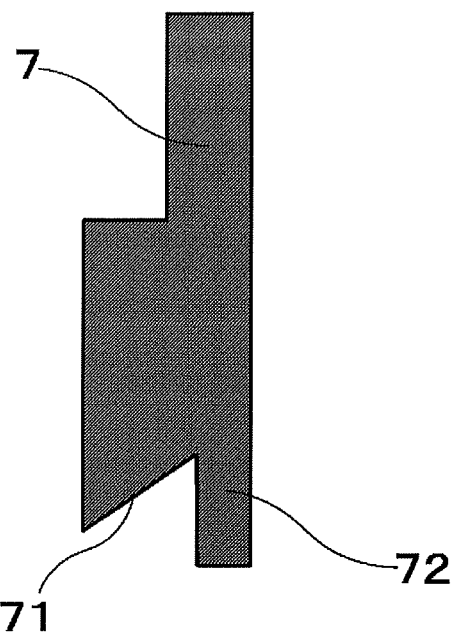
FIG. 3 is a cross-sectional structural diagram of a case member included in the power module according to Embodiment 1 of the present invention.

FIG. 3 is a cross-sectional structural diagram of the case member included in the power module according to Embodiment 1 of the present invention. In the figure, case member 7 includes angled surface 71 and protrusion 72. As shown in FIG. 2, case member 7 is surrounding insulative substrate 5 and the inner periphery portion side of the bottom surface (the surface on the same side as the bottom surface of power module 100) of case member 7 is in contact with the top surface of base plate 10. In other words, the tip of angled surface 71 of the bottom surface of case member 7 is in contact with the top surface of base plate 10.

At least the top surface of base plate 10 on the ceramic plate 2 side is a flat surface, typically, base plate 10 has flat rear and top surfaces. The bottom surface of case member 7 is provided with angled surface 71 whose distance to the top surface of base plate 10 is increased toward the outer periphery side of base plate 10. Furthermore, the outer periphery portion side of the bottom surface of case member 7 is provided with a protrusion 72 protruding beyond angled surface 71.

Case member 7 is required to cause no thermal distortion within the use temperature range of power module 100 and also maintain the electrically insulating properties. For this reason, a resin having a high softening point, such as a PPS (Poly Phenylene Sulfide) resin, PBT (Polybutylene terephthalate) resin, etc. is used for case member 7.

Case member 7 and base plate 10 are adhered by adhesive 9. Adhesive 9 is filled between angled surface 71 of the bottom surface of case member 7 and base plate 10. Generally, a silicone resin, an epoxy resin, etc. is used as a material of adhesive 9. Adhesive 9 is applied to at least one of case member 7 and base plate 10 to secure case member 7 and base plate 10, after which case member 7 and base plate 10 are adhered by thermal curing.

Preferably, adhesive 9 has a viscosity in a range from 60 to 200 Pa·s. If the viscosity is lower than 60 Pa·s, workability deteriorates. If the viscosity is higher than 200 Pa·s, adhesive 9 is prone to trapping bubbles, causing a concern for a decrease in mechanical durability.

In the present embodiment, as shown in FIG. 2, the portion of the bottom surface of case member 7, which contacts with the top surface of base plate 10, has an inclined shape (tapered shape) that tapers toward the inner periphery side. Owing to this, after adhesive 9 is applied to case member 7 or base plate 10, when securing case member 7 and base plate 10, adhesive 9 can be prevented from flowing out (flowing in) in a direction in which case member 7 and filling member 12 are in contact.

Moreover, since the bottom surface of case member 7 is provided with angled surface 71, angled surface 71 has a shape expanding toward the outer periphery side of case member 7. Thus, adhesive 9 is likely to flow to the outer periphery side of case member 7. As a result, adhesive 9 and filling member 12 are prevented from contacting with each other, which is a cause of them being disjoined. This inhibits filling member 12 from being disjoined, starting from a point of contact between adhesive 9 and filling member 12. Moreover, providing the bottom of case member 7 with angled surface 71 facilitates draining of bubbles out of adhesive 9 if they are entrained in adhesive 9.

Preferably, angled surface 71 of the bottom surface of case member 7 has a tilt angle of, for example, 5 degrees to 60 degrees. Since case member 7 is formed of a hard material, the rigidity of case member 7 can be secured even with angled surface 71 having a relatively steep angle. The angle of angled surface 71 may be selected, as appropriate, according to the height, thickness, and strength of case member 7. Note that the tilt angle of angled surface 71 needs not necessarily be constant. For example, angled surface 71 may be a combination of multiple angled surfaces having different angles, insofar as angled surface 71 can separate and eliminate the contact between adhesive 9 and filling member 12.

Providing the inner periphery portion side of the bottom surface of case member 7 with the protruding portion, which contacts with base plate 10, allows filling member 12 and adhesive 9 to be disposed, spaced from each other. However, this may not provide a sufficient adhesion strength. This is because if the thickness of case member 7 is fixed (if the size of the module is not changeable, etc.), providing the protruding portion decreases the contact area of base plate 10, and also decreases the adhesion strength between base plate 10 and case member 7. For this reason, the configuration with only the protruding portion, while it can eliminate the contact between filling member 12 and adhesive 9, makes it difficult to provide a configuration as a module.

In contrast, providing the bottom surface of case member 7 with angled surface 71 allows for an increase of the contact area with base plate 10, thereby allowing enhancement in the adhesion strength, without increasing the thickness of case member 7. Owing to this, the adhesion strength between case member 7 and base plate 10 can be secured even in the case of thin member 7.

Moreover, since the contact between adhesive 9 and filling member 12 is eliminated, the materials of adhesive 9 and filling member 12 which have been governed by the coefficient of linear expansion can be selected, free of the coefficient of linear expansion.

Protrusion 72, provided outwardly of angled surface 71 of the bottom surface of case member 7, protrudes from the top surface side toward the rear surface side of base plate 10. Protrusion 72 of case member 7 may also have an inner wall facing the side surface of base plate 10. Protrusion 72 having the inner wall as such allows adhesive 9 to be sufficiently secured, thereby securing the adhesion strength between case member 7 and base plate 10.

Electrode terminal 8 is insert molded or outsert molded onto case member 7, and used to receive/output a current and a voltage from/to the outside. Electrode terminal 8 has a structure of projecting out from the top surface of case member 7. A copper plate having, for example, a thickness of 0.5 mm, processed into a given shape by etching or die punching, can be used as electrode terminal 8.

Bonding wire 11 electrically connects between metal layers 3 or between semiconductor element 1 and electrode terminal 8. Bonding wire 11 is a wire made of aluminum alloy or copper alloy having a wire diameter of 0.1 to 0.5 mm, for example. While bonding wire 11 is used herein for the connection, a ribbon (plate member) may be used for the connection.

The region bounded by case member 7 and base plate 10 is filled with filling member 12 for the purposes of securing the electrically insulating properties inside the power module 100. Filling member 12 seals insulative substrate 5, metal layers 3, 4, semiconductor elements 1, and bonding wires 11. Filling member 12 is a resin added with an inorganic filler having excellent thermal conductivity, such as alumina, silica, etc. The resin is formed of a material combined with desired electrically insulating properties, heat resistance, and adhesiveness, such as an epoxy resin, a phenolic resin, a polyimide resin, etc. Note that even if adhesive 9 and filling member 12 are configured of the same material, the additive depends on the application, and thus adhesive 9 and filling member 12 do not always have the same coefficient of linear expansion. For this reason, thermal stress may be generated due to a difference in coefficient of linear expansion due to the heat cycle.

Next, the method for fabricating power module 100 configured as set forth above, according to Embodiment 1, will be described.

FIGS. 4 to 11 show cross-sectional structural diagrams illustrating steps of fabricating the power module according to Embodiment 1 of the present invention. FIGS. 4 to 11 show cross-sectional structural diagrams illustrating steps of fabricating the power module according to Embodiment 1 of the present invention. Power module 100 can be fabricated through the steps in FIGS. 4 to 11.

Figure 4:
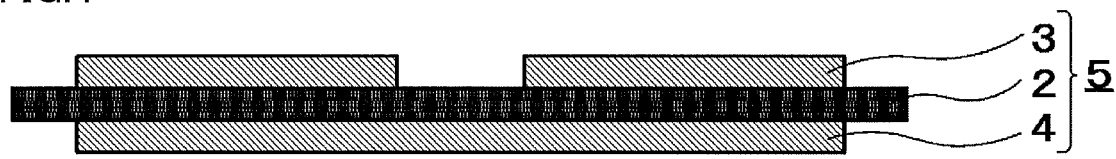
FIG. 4 is a cross-sectional structural diagram illustrating steps of fabricating the power module according to Embodiment 1 of the present invention.

Initially, as shown in FIG. 4, metal layers 3 are formed on the top surface of ceramic plate 2, and metal layer 4 is formed on the rear surface of ceramic plate 2 (the insulative substrate formation step). Ceramic plate 2 and metal layers 3, 4 are joined by brazing. Electrics circuit are formed on respective metal layers 3, 4, and thus metal layers 3, 4 often have different pattern shapes. In such a case, thermal stress can be inhibited from occurring above and below ceramic plate 2 by adjusting the sizes and thicknesses of metal layers 3, 4. Moreover, depending on power module 100, ceramic plate 2 may be replaced with an insulating sheet, which may be directly joined to base plate 10, without providing metal layer 4. In this case also, thermal stress of power module 100 can be inhibited from occurring by adjusting the sizes and thicknesses of metal layers 3 (e.g., the left and right metal layers 3 are made in balance in the case of FIG. 4).

Figure 5:
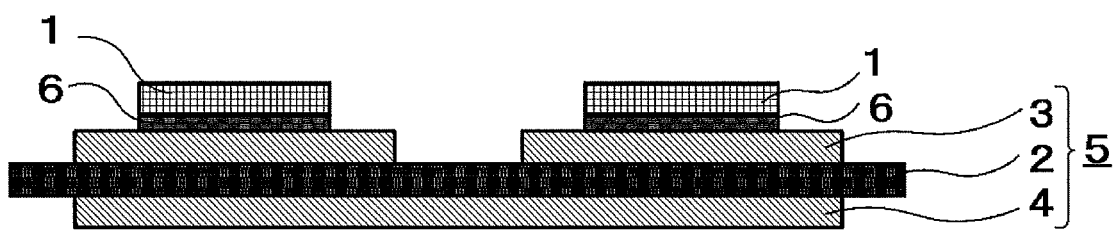
FIG. 5 is a cross-sectional structural diagram illustrating steps of fabricating the power module according to Embodiment 1 of the present invention.

Next, as shown in FIG. 5, semiconductor elements 1 are electrically joined to given positions (semiconductor element 1 layout areas) on metal layers 3 on the top surface of insulative substrate 5, using the solder which is joining material 6 (semiconductor element join step). As such, semiconductor elements 1 are joined to insulative substrate 5, thereby forming electric circuits. Joining material 6 is not limited to the solder, and other joining materials can be applied as well.

Figure 6:
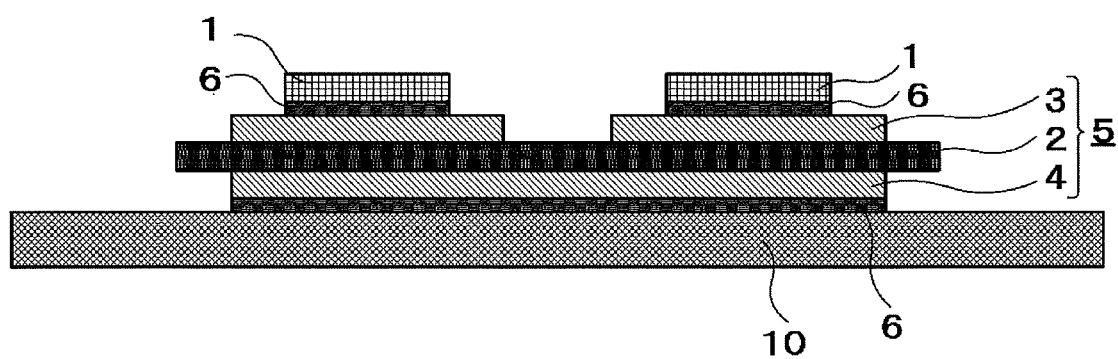
FIG. 6 is a cross-sectional structural diagram illustrating steps of fabricating the power module according to Embodiment 1 of the present invention.

Next, as shown in FIG. 6, the rear surface of insulative substrate 5 having semiconductor elements 1 joined thereto and the top surface of base plate 10 are joined via a solder which is joining material 6 (insulative substrate join step). Similarly to the above semiconductor element join step, they can be joined using a solder as joining material 6. Joining material 6 is not limited to the solder, and other joining materials can be applied as well.

Figure 7:
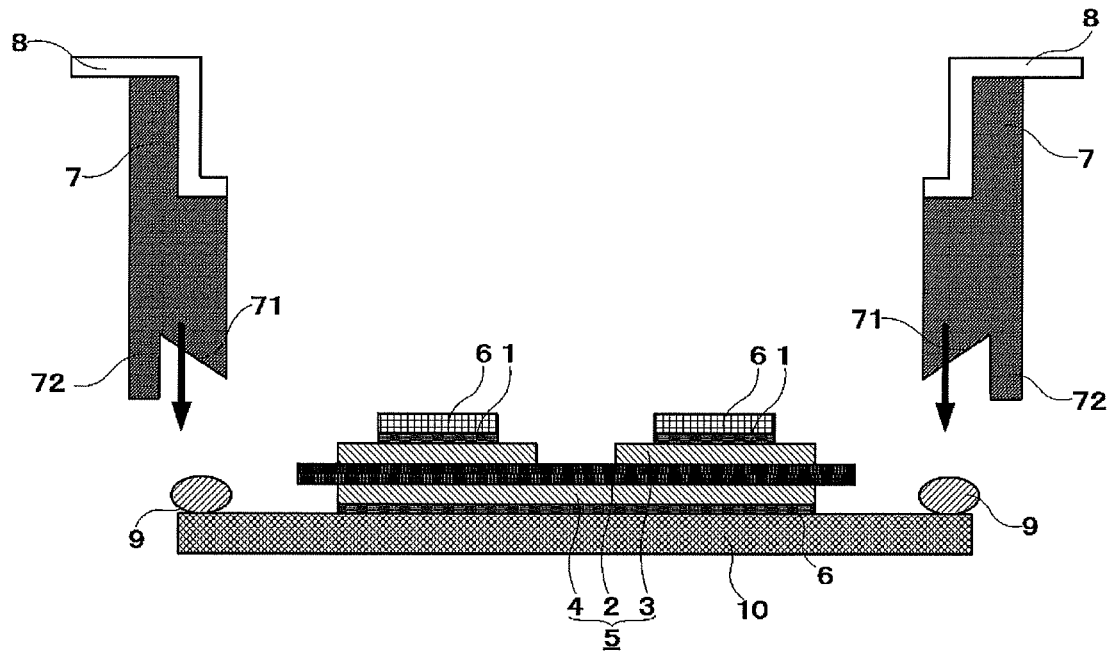
FIG. 7 is a cross-sectional structural diagram illustrating steps of fabricating the power module according to Embodiment 1 of the present invention.
Figure 8:
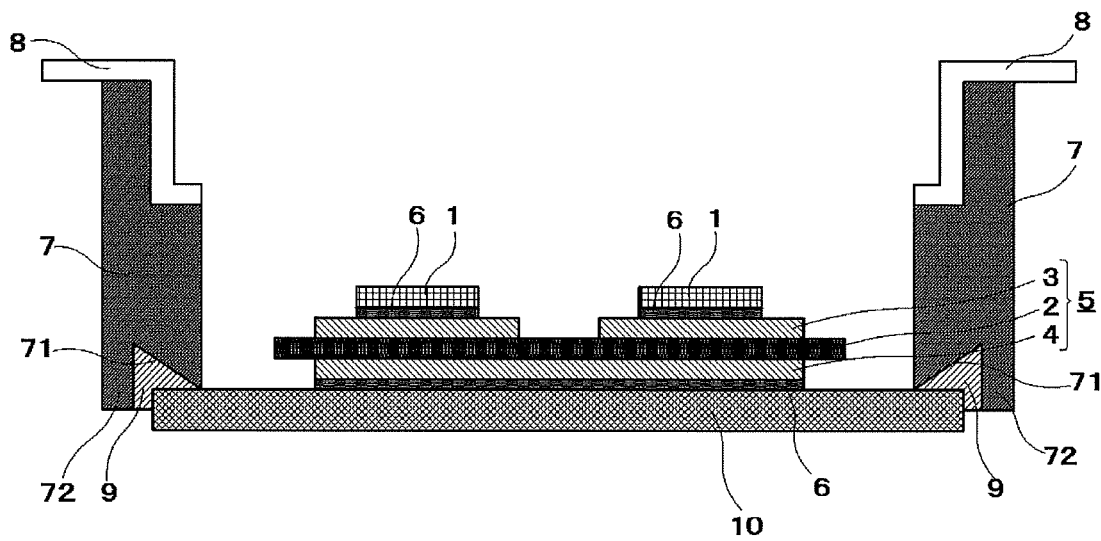
FIG. 8 is a cross-sectional structural diagram illustrating steps of fabricating the power module according to Embodiment 1 of the present invention.

Next, as shown in FIGS. 7, 8, case member 7 is adhered to the outer periphery (the side surface and a portion of the top surface) of base plate 10 by adhesive 9 so that the inner periphery portion side of the bottom surface of case member 7 provided with angled surface 71 is in contact with the top surface of base plate 10 to surround insulative substrate 5 with base plate 10 and case member 7 (case member adhering step). Here, the bottom surface of case member 7 is provided with angled surface 71 whose distance to the top surface of base plate 10 is increased toward the outer periphery side of base plate 10. Adhesive 9 is also filled between angled surface 71 of case member 7 and base plate 10.

For example, adhesive 9 is disposed at a given location on the outer periphery of base plate 10. After adhesive 9 is disposed, case member 7 is pressure welded from above the base plate 10 onto the top surface of base plate 10, at which time, adhesive 9 is pushed out by angled surface 71, provided on the bottom of case member 7, from the inner periphery side of case member 7 toward the outer periphery side, also flowing to the side surface side of base plate 10 along protrusion 72 of case member 7. Adhesive 9 hardens, thereby adhering case member 7 to the outer periphery (side surface) of base plate 10, as shown in FIG. 8. This places insulative substrate 5 in the region bounded by case member 7 and base plate 10. Here, adhesive 9 is adjusted to have a viscosity so as to be in a shape as shown in FIG. 8. Adhesive 9 can be hardened by being heated, for example, at 120 degrees Celsius for two hours as processing conditions for hardening adhesive 9. Note that processing conditions of hardening adhesive 9 may be selected as appropriate, according to a material of adhesive 9.

Figure 9:
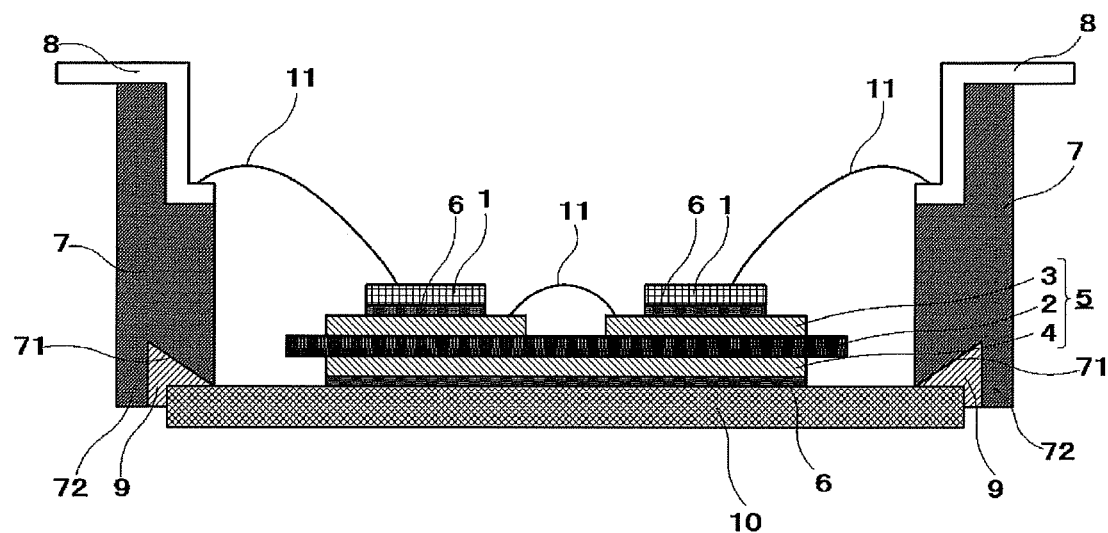
FIG. 9 is a cross-sectional structural diagram illustrating steps of fabricating the power module according to Embodiment 1 of the present invention.

Next, as shown in FIG. 9, semiconductor elements 1 joined to metal layers 3 on the top surface of insulative substrate 5 and electrode terminal 8 provided on case member 7 are electrically connected via bonding wires 11 (line member forming step). Similarly, metal layer 3 and metal layer 3 are electrically connected via bonding wires 11 (line member forming step). Bonding wires 11 further connect electrodes (not shown) which are formed on given regions of semiconductor elements 1 and given regions (not shown) of electrode terminal 8.

Figure 10:
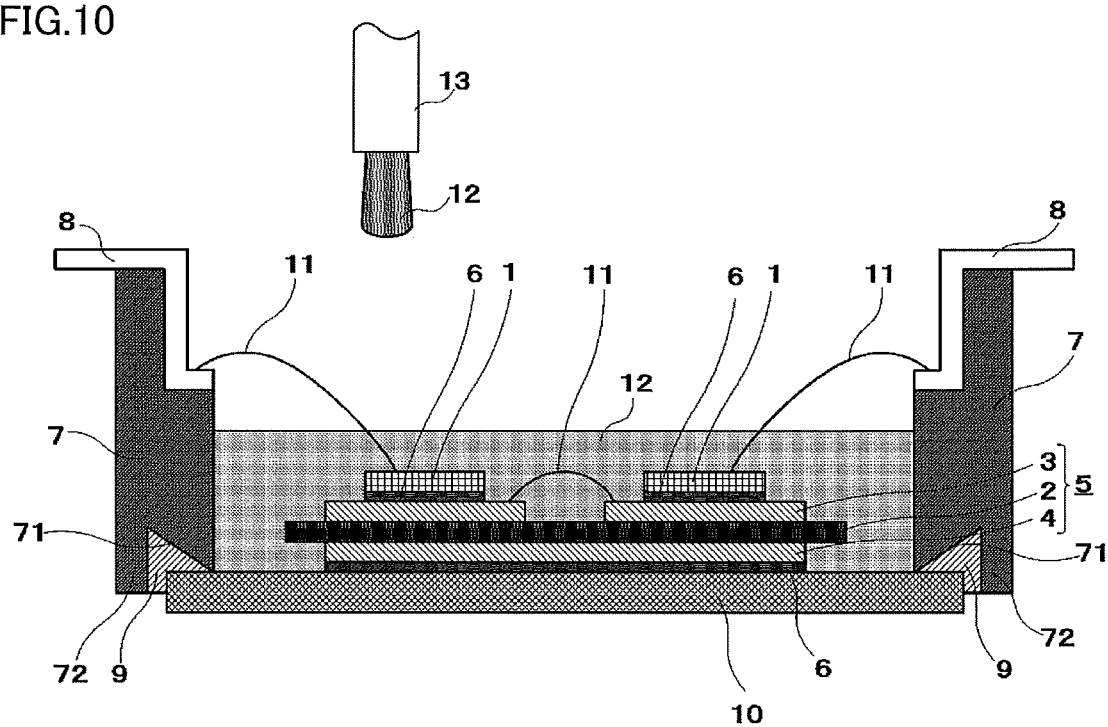
FIG. 10 is a cross-sectional structural diagram illustrating steps of fabricating the power module according to Embodiment 1 of the present invention.

Next, as shown in FIG. 10, the region bounded by base plate 10 and case member 7 is filled with filling member 12 (filling member filling step). Filling member 12 is filled in the region bounded by case member 7 and base plate 10, using, for example, dispenser 13. FIG. 10 is schematic representation of filling of the region with filling member 12. As the fill level (fill amount) of filling member 12, the region is filled with filling member 12 to a level at which bonding wire 11 is covered (sealed). After the region is filled with filling member 12, a hardening process is carried out. For example, filling member 12 is hardened by being heated at 150 degrees Celsius for two hours as processing conditions for hardening filling member 12 (filling member hardening step). As such, the filled filling member 12 is hardened by performing the hardening process. The processing conditions for hardening filling member 12 may be selected as appropriate, according to a material of filling member 12, etc.

Figure 11:
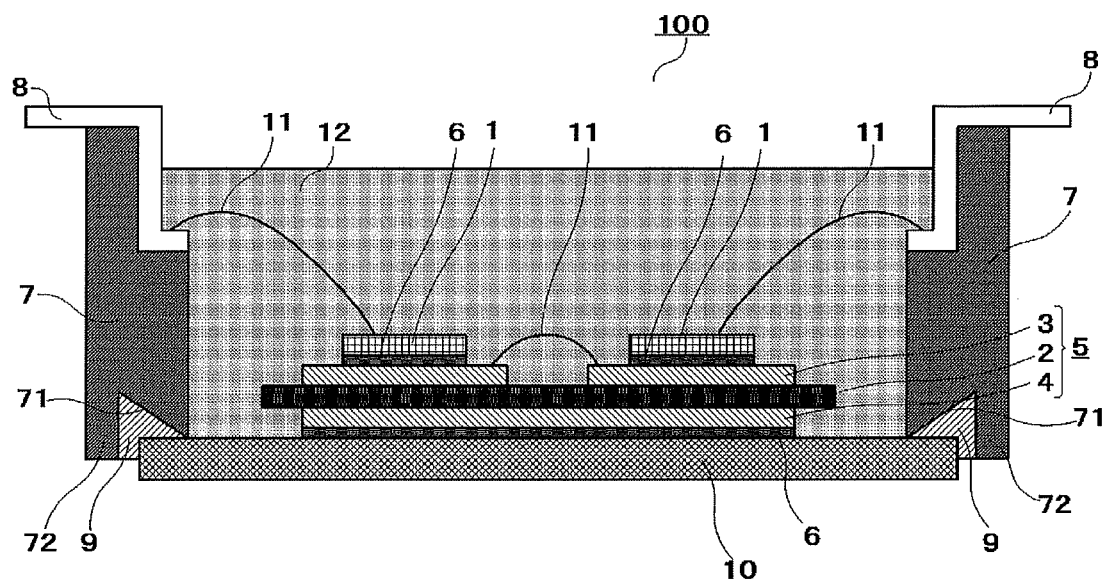
FIG. 11 is a cross-sectional structural diagram illustrating steps of fabricating the power module according to Embodiment 1 of the present invention.

Power module 100, shown in FIG. 11, can be fabricated through the above major fabrication steps.

Figure 12:
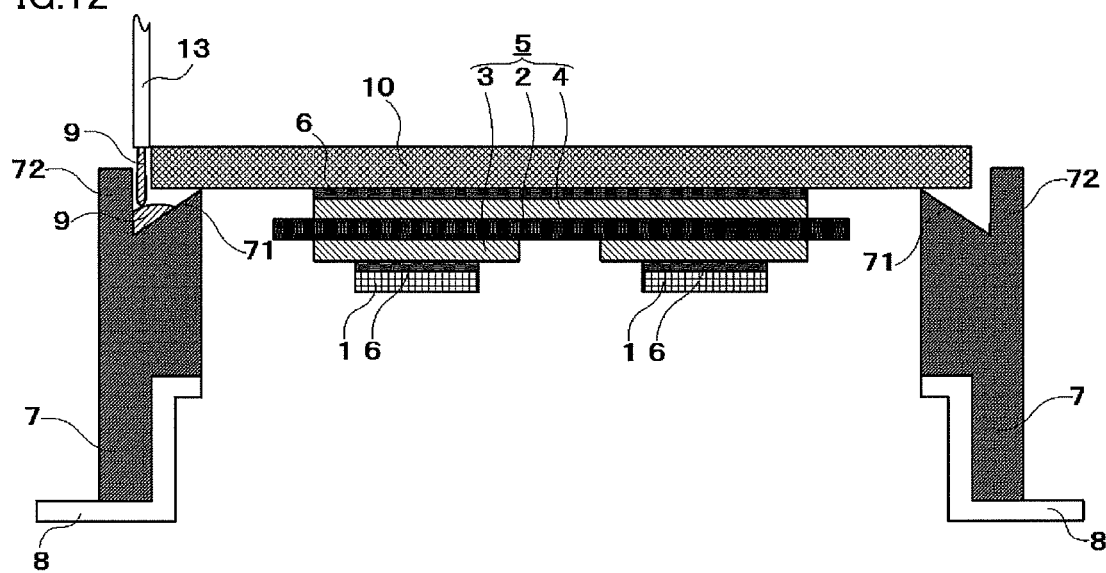
FIG. 12 is a cross-sectional structural diagram illustrating another steps of fabricating the power module according to Embodiment 1 of the present invention.

FIG. 12 is a cross-sectional structural diagram illustrating another steps of fabricating, the power module according to Embodiment 1 of the present invention. In the steps of fabricating power module 100, when adhering case member 7 and base plate 10 shown in FIG. 7 using adhesive 9, case member 7 and base plate 10 can be adhered while case member 7 is disposed with the bottom surface up and case member 7 and base plate 10 are disposed with the bottom surface of case member 7 and the top surface of base plate 10 in contact with (facing) each other, as shown in FIG. 12.

More specifically, as shown in FIG. 12, case member 7 is disposed with the bottom surface up. After case member 7 is disposed, base plate 10 is disposed on case member 7 so that the vertex portion of the inner periphery side of angled surface 71 of the bottom surface of case member 7 is in contact with the top surface of base plate 10. After base plate 10 is disposed on case member 7, adhesive 9 is filled in the region bounded by angled surface 71 and protrusion 72 of case member 7 and base plate 10, using dispenser 13 (adhesive member filling step). After the adhesive 9 is filled, adhesive 9 is hardened, thereby adhering case member 7 and base plate 10 (case member adhering step).

Then, power module 100 can be fabricated through the steps illustrated in FIGS. 9 to 11.

In power module 100 configured as the above, since the bottom surface of case member 7 is provided with angled surface 71, and case member 7 is disposed so that the inner periphery portion side of the bottom surface of case member 7 is in contact with the top surface of base plate 10, filling member 12 and adhesive 9 can be separated without contacting with each other, thereby inhibiting filling member 12 and adhesive 9 from being disjoined.

Moreover, since the bottom surface of case member 7 is provided with angled surface 71, and case member 7 is disposed so that the inner periphery portion side of the bottom surface of case member 7 is in contact with the top surface of base plate 10, electrical insulation properties improve, thereby improving the reliability of the power module.

Furthermore, since the bottom surface of case member 7 is provided with angled surface 71, adhesive 9 is facilitated to flow to the outer periphery side of case member 7, while eliminating the contact between filling member 12 and adhesive 9, thereby allowing case member 7 and base plate 10 to be uniformly adhered.

Moreover, since the bottom surface of case member 7 is provided with angled surface 71, the contact area between case member 7 and base plate 10 is increased, thereby improving the adhesion strength between case member 7 and base plate 10.

Furthermore, since the bottom surface of case member 7 is provided with angled surface 71 and case member 7 is disposed so that the inner periphery portion side of the bottom surface of case member 7 is in contact with the top surface of base plate 10, one can select the material of adhesive 9 and the material of filling member 12, independent of each other, allowing an expanded degree of freedom to be provided with respect to selection of material.

Embodiment 2

Embodiment 2 is the same as Embodiment 1, except for providing the inner periphery side of angled surface 71, provided on the bottom surface of case member 7 according to Embodiment 1 with a flat portion 73, the inner periphery side being in contact with the top surface of base plate 10. As such, flat portion 73 is formed inwardly of angled surface 71 of the bottom surface of case member 7, thereby providing an increased distance from adhesive 9 to filling member 12, effectively suppressing adhesive 9 from flowing to the filling member 12 side. Moreover, since flat portion 73 is provided, a force exerted on case member 7 can be dispersed. As a result, filling member 12 and adhesive 9 can be inhibited from contacting with each other, inhibiting filling member 12 from disjoining. Furthermore, the reliability of the power module can be improved. Note that, in other respects, Embodiment 2 is the same as Embodiment 1, and thus detailed description thereof will be omitted.

Even in the case of such a structure, contact between filling member 12 and adhesive 9 can be eliminated by bringing case member 7 and base plate 10 into contact, thereby inhibiting filling member 12 from disjoining.

Figure 13:
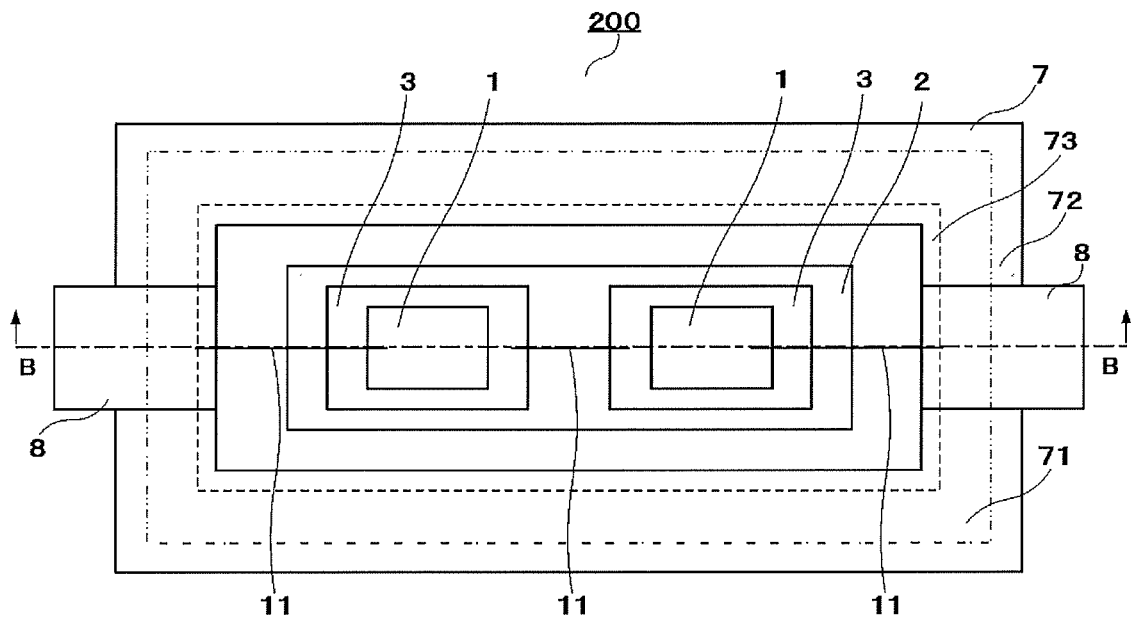
FIG. 13 is a planar structural diagram of a power module according to Embodiment 2 of the present invention.
Figure 14:
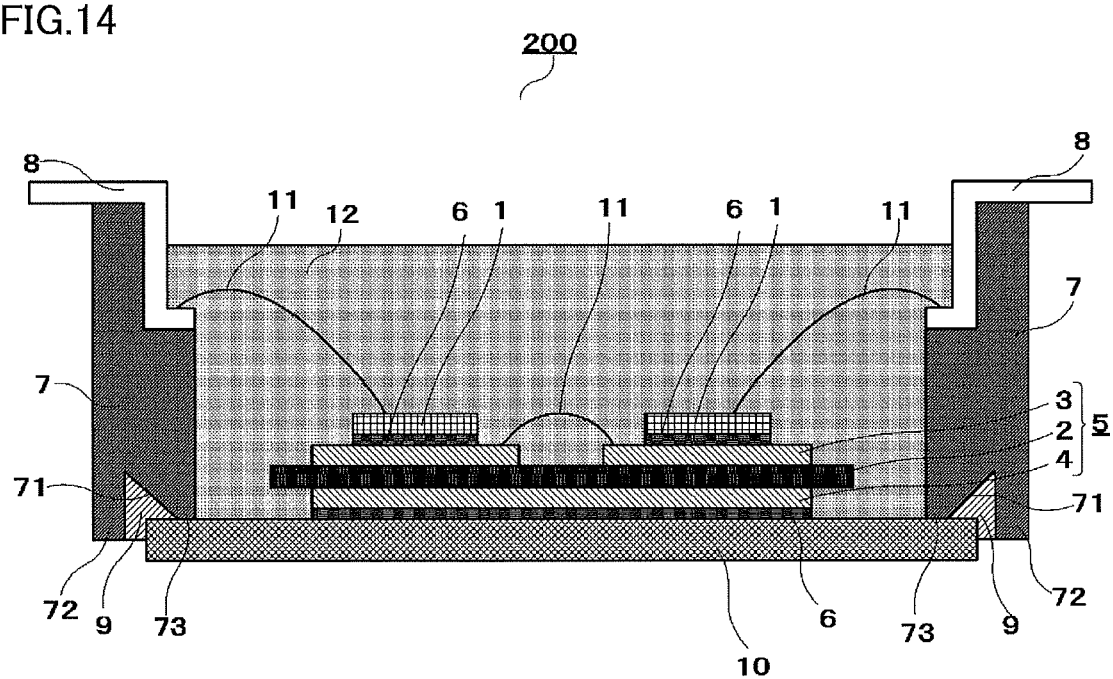
FIG. 14 is a cross-sectional structural diagram of the power module according to Embodiment 2 of the present invention.
Figure 15:
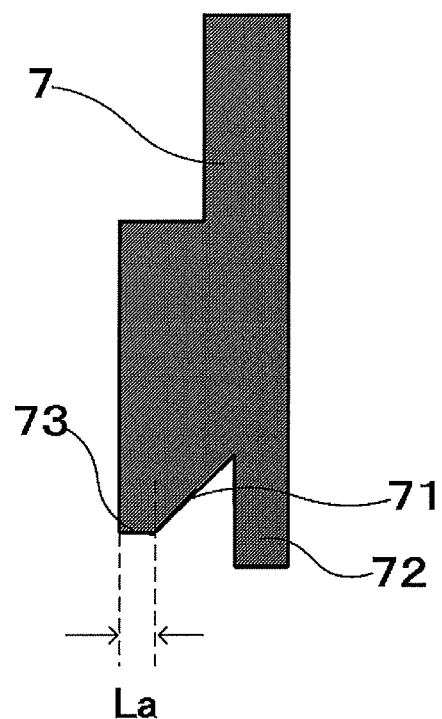
FIG. 15 is a cross-sectional structural diagram of a case member included in the power module according to Embodiment 2 of the present invention.

FIG. 13 is a planar structural diagram of a power module according to Embodiment 2 of the present invention. FIG. 14 is a cross-sectional structural diagram of the power module according to Embodiment 2 of the present invention. FIG. 15 is a cross-sectional structural diagram of a case member included in the power module according to Embodiment 2 of the present invention. The cross-sectional structural diagram taken along the dotted line BB in FIG. 13 is shown in FIG. 14. In the figure, a power module 200 includes semiconductor elements 1, an insulative substrate 5, joining materials 6, a case member 7, an electrode terminal 8, an adhesive 9, a base plate 10, bonding wires 11 which are line members, and a filling member 12. Case member 7 includes an angled surface 71, a protrusion 72, and a flat portion 73.

In FIG. 13, the portion between the inner periphery of case member 7 and the dotted line is flat portion 73 of case member 7 that is in contact with base plate 10. Moreover, the portion between the dotted line and the two-dot chain line is angled surface 71 of case member 7. Furthermore, the portion between the two-dot chain line and the outer periphery of case member 7 is protrusion 72 of case member 7.

In FIG. 15, flat portion 73 of case member 7 is provided on the inner periphery portion side of the bottom surface of case member 7, and in contact with the top surface of base plate 10. La indicates the width (thickness) of flat portion 73 of case member 7. Desirably, width La of flat portion 73 of case member 7 is less than or equal to 1 min. Providing case member 7 with flat portion 73 brings case member 7 into contact with base plate 10 with the inner periphery side of case member 7 as a surface, thereby inhibiting cracks from occurring at the edge of the bottom surface of case member 7.

Moreover, since the bottom surface of case member 7 is in contact with base plate 10 as a surface, a force exerted on the point of contact, when adhering case member 7 and base plate 10, can be dispersed, thereby achieving a more stable structure. Furthermore, since the bottom surface of case member 7 is provided with flat portion 73, the edge of flat portion 73 on the inner periphery portion side may have a curvature. The edge of flat portion 73 on the inner periphery portion side having a curvature allows a reduction of stress at the edge of flat portion 73 when adhering case member 7 and base plate 10, while eliminating the contact between filling member 12 and adhesive 9, thereby effectively inhibiting cracks from occurring at the edge.

In power module 200 configured as the above, since the bottom surface of case member 7 is provided with angled surface 71, and case member 7 is disposed so that the inner periphery portion side of the bottom surface of case member 7 is in contact with the top surface of base plate 10, filling member 12 and adhesive 9 can be separated without contacting with each other, thereby inhibiting filling member 12 and adhesive 9 from being disjoined.

Moreover, since the bottom surface of case member 7 is provided with angled surface 71, and case member 7 is disposed so that the inner periphery portion side of the bottom surface of case member 7 is in contact with the top surface of base plate 10, electrical insulation properties improve, thereby improving the reliability of the power module.

Furthermore, since the bottom surface of case member 7 is provided with angled surface 71, adhesive 9 is facilitated to flow to the outer periphery side of case member 7, while eliminating the contact between filling member 12 and adhesive 9, thereby allowing case member 7 and base plate 10 to be uniformly adhered.

Moreover, since the bottom surface of case member 7 is provided with angled surface 71, the contact area between case member 7 and base plate 10 is increased, thereby improving the adhesion strength between case member 7 and base plate 10.

Furthermore, since the inner periphery portion side of the bottom surface of case member 7 is provided with flat portion 73, filling member 12 and adhesive 9 are spaced apart from each other and filling member 12 and adhesive 9 can be separated without contacting with each other, thereby inhibiting filling member 12 and adhesive 9 from being disjoined.

Moreover, since the bottom surface of case member 7 is provided with angled surface 71 and case member 7 is disposed so that the inner periphery portion side of the bottom surface of case member 7 is in contact with the top surface of base plate 10, one can select the material of adhesive 9 and the material of filling member 12, independent of each other, thereby allowing an expanded degree of freedom to be provided with respect to selection of material.

Embodiment 3

Embodiment 3 is the same as Embodiment 1, except for the inner periphery side (the surface facing the side surface of base plate 10) of protrusion 72 provided on the bottom surface of case member 7 according to Embodiment 1, the inner periphery side having a shape (having a second angled surface 74) in which the distance from the inner periphery side of protrusion 72 to the side surface of base plate 10 increases toward the rear surface side of base plate 10. As such, since protrusion 72 of case member 7 has the shape in which the distance from protrusion 72 to the side surface of base plate 10 increases toward the rear surface side of base plate 10, filling member 12 can be efficiently caused to flow to the outside when adhering case member 7 and base plate 10, thereby effectively suppressing adhesive 9 from flowing to the filling member 12 side. As a result, the contact between filling member 12 and adhesive 9 is eliminated, thereby inhibiting filling member 12 from disjoining. Moreover, the reliability of the power module can be improved. Note that, in other respects, Embodiment 3 is the same as Embodiment 1, and thus detailed description thereof will be omitted.

Even in the case of such a structure, the contact between filling member 12 and adhesive 9 is eliminated by bringing case member 7 and base plate 10 into contact, thereby inhibiting filling member 12 from disjoining.

Figure 16:
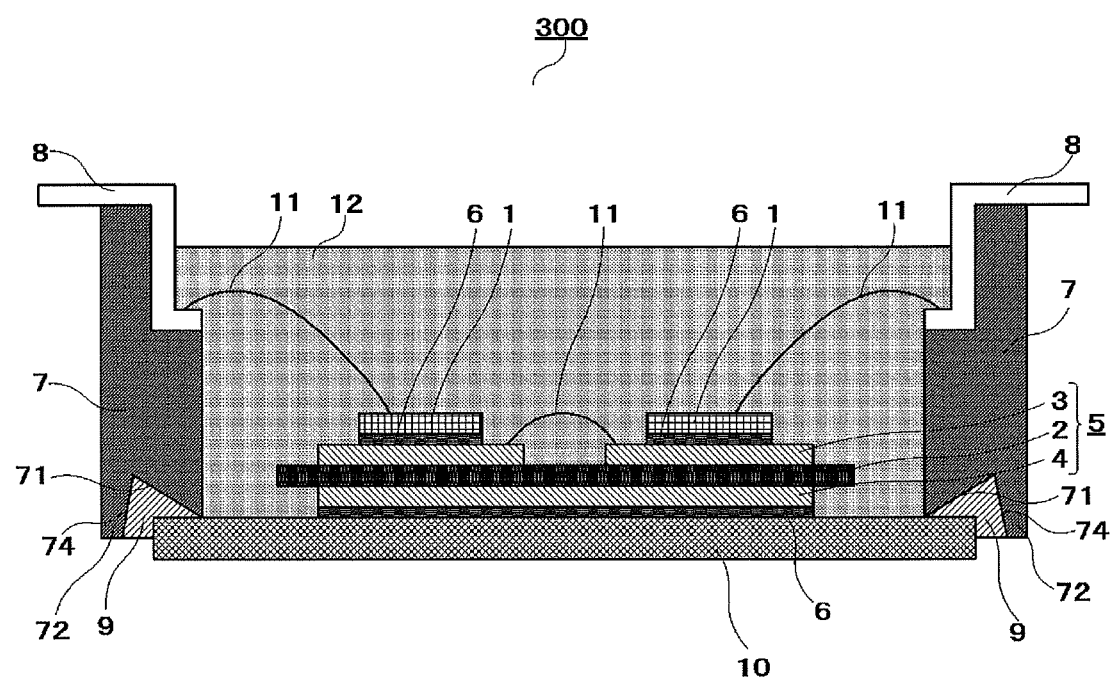
FIG. 16 is a cross-sectional structural diagram of a power module according to Embodiment 3 of the present invention.
Figure 17:
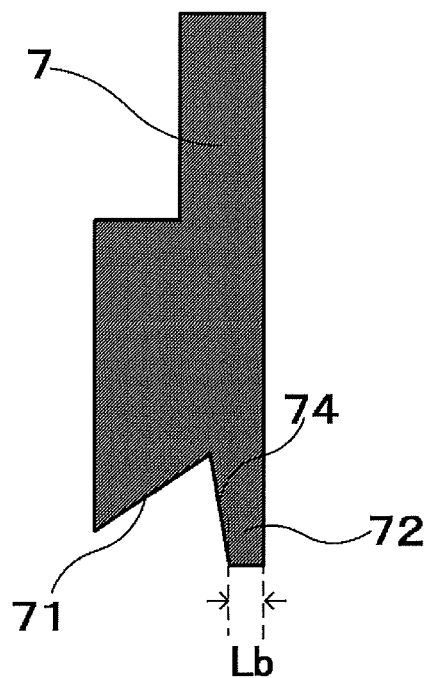
FIG. 17 is a cross-sectional structural diagram of the case member included in the power module according to Embodiment 3 of the present invention.

FIG. 16 is a cross-sectional structural diagram of the power module according to Embodiment 3 of the present invention. FIG. 17 is a cross-sectional structural diagram of the case member included in the power module according to Embodiment 3 of the present invention. In the figure, a power module 300 includes semiconductor elements 1, an insulative substrate 5, joining materials 6, a case member 7, an electrode terminal 8, an adhesive 9, a base plate 10, bonding wires 11 which are line members, and a filling member 12. Moreover, case member 7 includes a first angled surface 71, a protrusion 72, and a second angled surface 74.

In FIG. 17, second angled surface 74 of case member 7 is provided on the inner periphery side of protrusion 72 of case member 7, the inner periphery side of protrusion 72 facing the side surface of base plate 10. Lb indicates the width (thickness) of the bottom surface of protrusion 72 provided with second angled surface 74. Preferably, width Lb of the bottom surface of protrusion 72 when case member 7 is provided with second angled surface 74 is greater than or equal to 1 mm. If width Lb of the bottom surface of protrusion 72 is less than 1 mm, the bottom surface of protrusion 72 is tapered, which may cause cracks when adhering case member 7 and base plate 10. Width Lb being 1 mm or greater allows power module 300 to be fabricated, suppressing development of cracks.

In power module 300 configured as the above, since the bottom surface of case member 7 is provided with angled surface 71, and case member 7 is disposed so that the inner periphery portion side of the bottom surface of case member 7 is in contact with the top surface of base plate 10, filling member 12 and adhesive 9 can be separated without contacting with each other, thereby inhibiting filling member 12 and adhesive 9 from being disjoined.

Moreover, since the bottom surface of case member 7 is provided with angled surface 71, and case member 7 is disposed so that the inner periphery portion side of the bottom surface of case member 7 is in contact with the top surface of base plate 10, electrical insulation properties improve, thereby improving the reliability of the power module.

Furthermore, since the bottom surface of case member 7 is provided with angled surface 71, adhesive 9 is facilitated to flow to the outer periphery side of case member 7, while eliminating the contact between filling member 12 and adhesive 9, thereby allowing case member 7 and base plate 10 to be uniformly adhered.

Moreover, since the bottom surface of case member 7 is provided with angled surface 71, the contact area between case member 7 and base plate 10 is increased, thereby improving the adhesion strength between case member 7 and base plate 10.

Furthermore, since protrusion 72 of case member 7 has the shape in which the distance from protrusion 72 to the side surface of base plate 10 increases toward the rear surface side of base plate 10, filling member 12 can be efficiently caused to flow to the outside when adhering case member 7 and base plate 10.

Moreover, since the bottom surface of case member 7 is provided with angled surface 71 and case member 7 is disposed so that the inner periphery portion side of the bottom surface of case member 7 is in contact with the top surface of base plate 10, one can select the material of adhesive 9 and the material of filling member 12, independent of each other, allowing an expanded degree of freedom to be provided with respect to selection of material.

Embodiment 4

Embodiment 4 is the same as Embodiment 1, except for including a fitting portion 75 and recess 76 for receiving fitting portion 75, the fitting portion 75 being provided on the inner periphery portion side of angled surface 71 provided on the bottom surface of case member 7, the inner periphery portion side being in contact with the top surface of base plate 10, the recess 76 being provided in the top surface of base plate 10. As such, fitting portion 75 is formed on the inner side of the bottom surface of case member 7 and is fitted into recess 76, thereby providing an increased distance from adhesive 9 to filling member 12, effectively suppressing adhesive 9 from flowing to the filling member 12 side. As a result, contact between filling member 12 and adhesive 9 is eliminated, thereby inhibiting filling member 12 from disjoining. Moreover, case member 7 is provided with fitting portion 75 which is fitted into recess 76, thereby reinforcing the fixation between case member 7 and base plate 10, improving the adhesion strength therebetween. Furthermore, the reliability of the power module improves. Note that, in other respects, Embodiment 4 is the same as Embodiment 1, and thus detailed description thereof will be omitted.

Even in the case of such a structure, the contact between filling member 12 and adhesive 9 is eliminated by bringing case member 7 and base plate 10 into contact, thereby inhibiting filling member 12 from disjoining.

Figure 18:
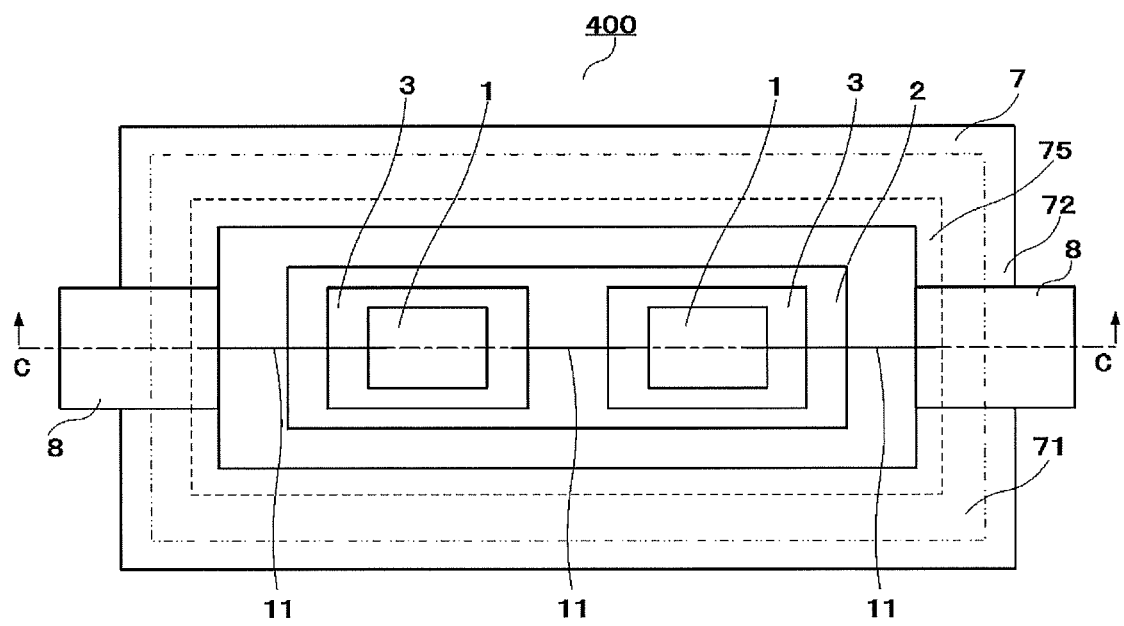
FIG. 18 is a planar structural diagram of a power module according to Embodiment 4 of the present invention.
Figure 19:
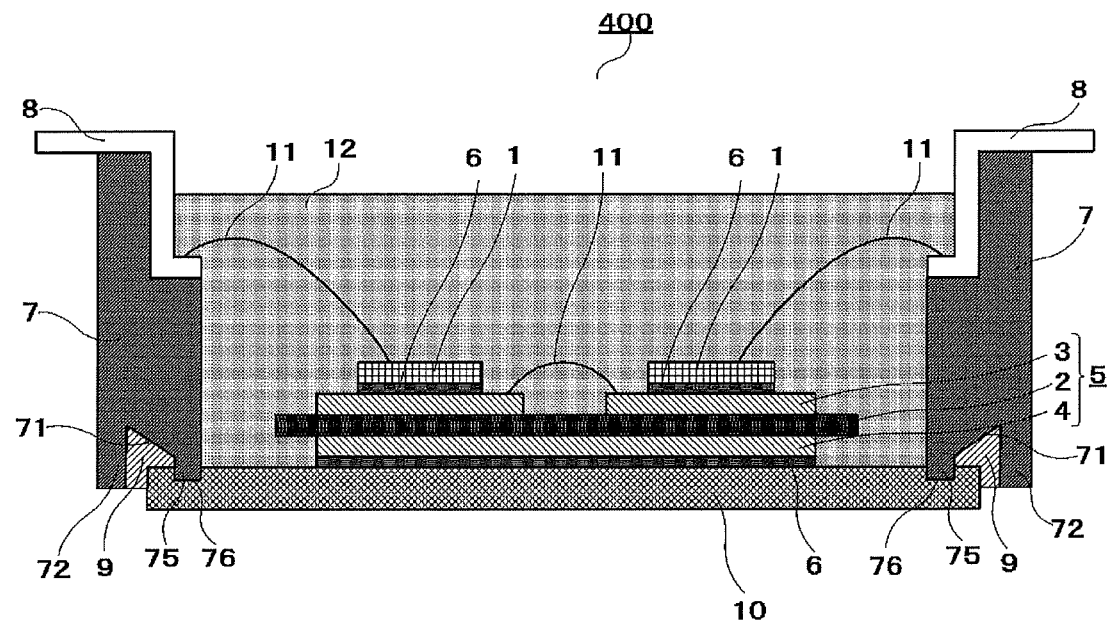
FIG. 19 is a cross-sectional structural diagram of the power module according Embodiment 4 of the present invention.
Figure 20:
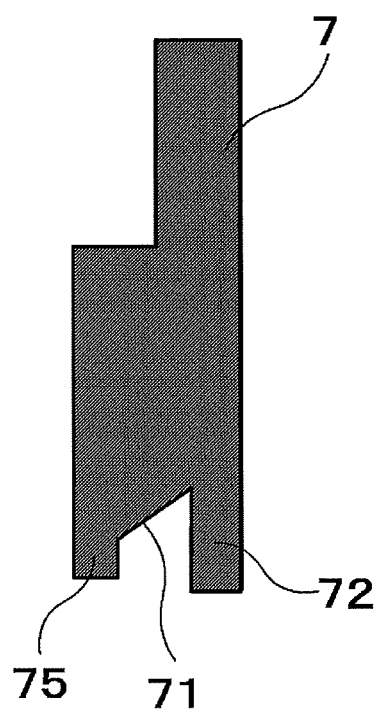
FIG. 20 is a cross-sectional structural diagram of a case member included in the power module according Embodiment 4 of the present invention.

FIG. 18 is a planar structural diagram of the power module according to Embodiment 4 of the present invention. FIG. 19 is a cross-sectional structural diagram of the power module according to Embodiment 4 of the present invention. FIG. 20 is a cross-sectional structural diagram of a case member included in the power module according to Embodiment 4 of the present invention. The cross-sectional structural diagram taken along the dotted line CC in FIG. 18 is shown in FIG. 19. In the figure, a power module 400 includes semiconductor elements 1, an insulative substrate 5, joining materials 6, a case member 7, an electrode terminal 8, an adhesive 9, a base plate 10, bonding wires 11 which are line members, and a filling member 12. Case member 7 includes an angled surface 71, a protrusion 72, and fitting portion 75. Base plate 10 includes a recess 76.

In FIG. 18, the portion between the inner periphery of case member 7 and the dotted line is fitting portion 75 of case member 7 fitted into recess 76 of base plate 10. Moreover, the portion between the dotted line and the two-dot chain line is angled surface 71 of case member 7. Furthermore, the portion between the two-dot chain line and the outer periphery of case member 7 is protrusion 72 of case member 7.

In FIGS. 19, 20, fitting portion 75 of case member 7 is provided on the inner periphery portion side of the bottom surface of case member 7, the inner periphery portion side of case member 7 being in contact with the top surface of base plate 10. Moreover, recess 76 for receiving fitting portion 75 is provided in the top surface of base plate 10 so that recess 76 faces fitting portion 75 of case member 7. Recess 76 provided in the top surface of base plate 10 has a shape corresponding to a shape of fitting portion 75 of case member 7. Fitting portion 75 of case member 7 is fitted into recess 76 of base plate 10, thereby further ensuring that adhesive 9 and filling member 12 are prevented from contacting with each other.

Figure 21:
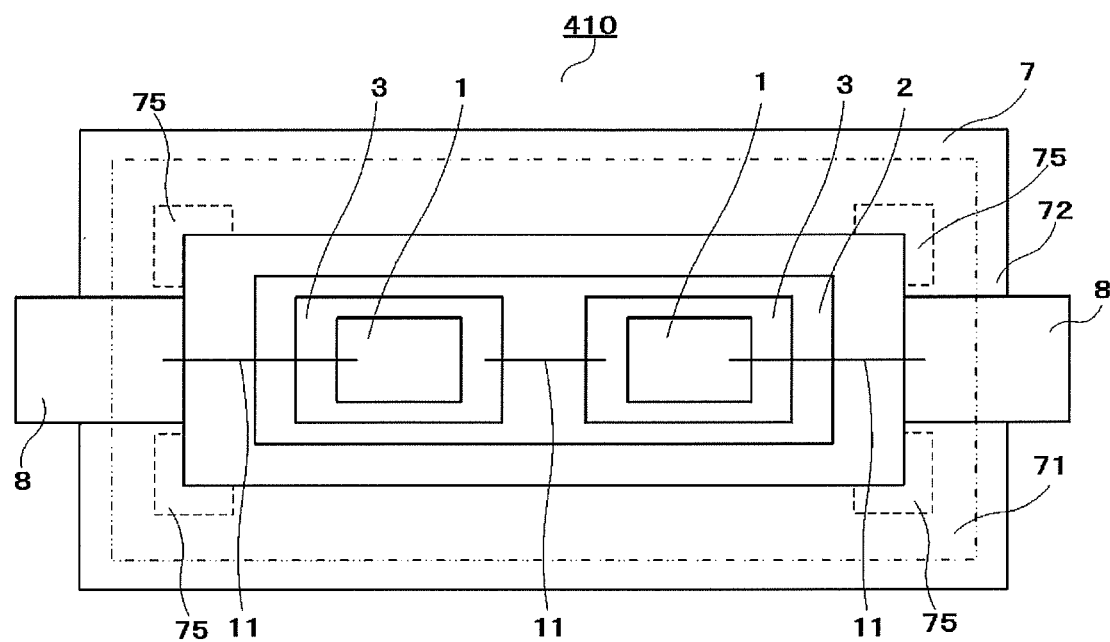
FIG. 21 is a planar structural diagram of another power module according to Embodiment 4 of the present invention.

FIG. 21 is a planar structural diagram of another power module according to Embodiment 4 of the present invention. The figure shows an example in which a power module 410 has fitting portions 75 of case member 7 provided at four corners of the bottom of case member 7 where adhesive 9 is facilitated to flow in, rather than providing fitting portion 75 of case member 7 around the entire inner periphery portion side of the bottom surface of case member 7 as shown in FIG. 18. However, fitting portion 75 of case member 7 may be interspersed where necessary, according to a size of case member 7.

In power modules 400, 410 configured as the above, since the bottom surface of case member 7 is provided with angled surface 71, and case member 7 is disposed so that the inner periphery portion side of the bottom surface of case member 7 is in contact with the top surface of base plate 10, filling member 12 and adhesive 9 can be separated without contacting with each other, thereby inhibiting filling member 12 and adhesive 9 from being disjoined.

Moreover, since the bottom surface of case member 7 is provided with angled surface 71, and case member 7 is disposed so that the inner periphery portion side of the bottom surface of case member 7 is in contact with the top surface of base plate 10, electrical insulation properties improve, thereby improving the reliability of the power module.

Furthermore, since the bottom surface of case member 7 is provided with angled surface 71, adhesive 9 is facilitated to flow to the outer periphery side of case member 7, while eliminating the contact between filling member 12 and adhesive 9, thereby allowing case member 7 and base plate 10 to be uniformly adhered.

Moreover, since the bottom surface of case member 7 is provided with angled surface 71, the contact area between case member 7 and base plate 10 is increased, thereby improving the adhesion strength between case member 7 and base plate 10.

Furthermore, since the inner periphery portion side of the bottom surface of case member 7 is provided with fitting portion 75, filling member 12 and adhesive 9 are spaced apart from each other and filling member 12 and adhesive 9 can be separated without contacting with each other, thereby inhibiting filling member 12 and adhesive 9 from being disjoined.

Moreover, since the inner periphery portion side of the bottom surface of case member 7 is provided with fitting portion 75, the adhesion strength between case member 7 and base plate 10 can be improved.

Furthermore, since the bottom surface of case member 7 is provided with angled surface 71 and case member 7 is disposed so that the inner periphery portion side of the bottom surface of case member 7 is in contact with the top surface of base plate 10, one can select the material of adhesive 9 and the material of filling member 12, independent of each other, allowing an expanded degree of freedom to be provided with respect to selection of material.

Embodiment 5

Embodiment 5 is the same as Embodiment 1, except for providing angled surface 71 formed on the bottom surface of case member 7, according to Embodiment 1, from the inner periphery portion side to the outer periphery portion side (over the entire surface) of case member 7. As such, since angled surface 71 is formed over the entire bottom surface of case member 7, filling member 12 and adhesive 9 can be separated without contacting with each other, thereby effectively suppressing adhesive 9 from flowing to the filling member 12 side. As a result, contact between filling member 12 and adhesive 9 is eliminated, thereby inhibiting filling member 12 from disjoining. The reliability of the power module also improves. Note that, in other respects, Embodiment 5 is the same as Embodiment 1, and thus detailed description thereof will be omitted.

Even in the case of such a structure, the contact between filling member 12 and adhesive 9 is eliminated by bringing case member 7 and base plate 10 into contact, thereby inhibiting filling member 12 from disjoining.

Figure 22:
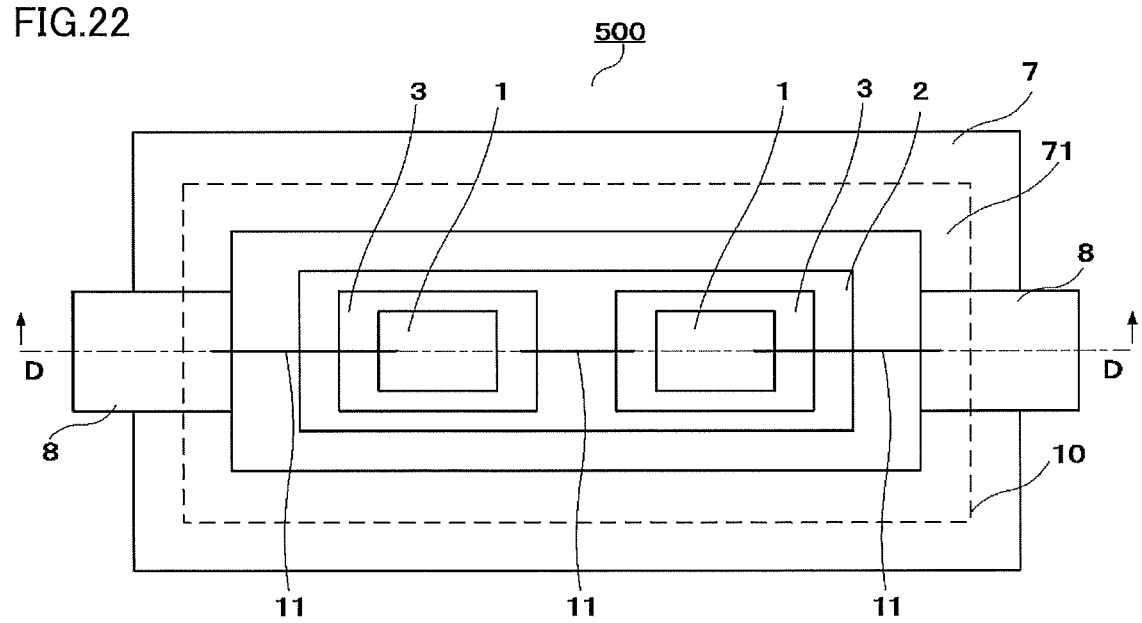
FIG. 22 is a planar structural diagram of a power module according Embodiment 5 of the present invention.
Figure 23:
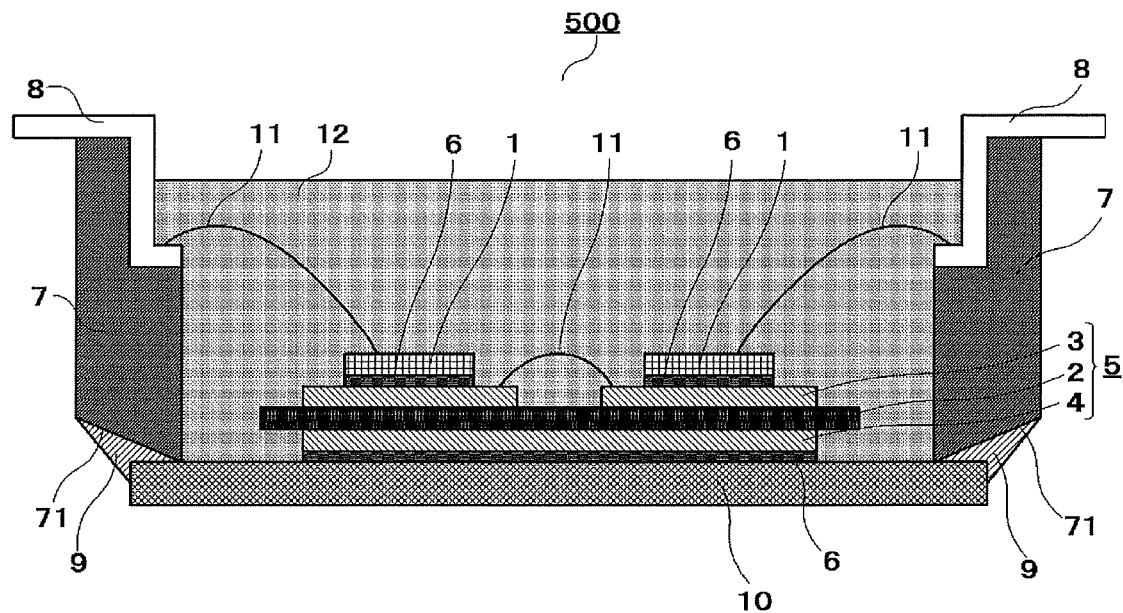
FIG. 23 is a cross-sectional structural diagram of the power module according to Embodiment 5 of the present invention.
Figure 24:
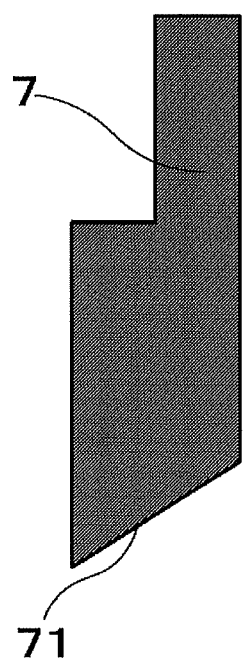
FIG. 24 is a cross-sectional structural diagram of a case member included in the power module according to Embodiment 5 of the present invention.

FIG. 22 is a planar structural diagram showing a power module according to Embodiment 5 of the present invention. FIG. 23 is a cross-sectional structural diagram showing the power module according to Embodiment 5 of the present invention. FIG. 24 is a cross-sectional structural diagram showing a case member included in the power module according to Embodiment 5 of the present invention. The cross-sectional structural diagram taken along the dotted line DD in FIG. 22 is shown in FIG. 23. In the figure, power module 300 includes semiconductor elements 1, an insulative substrate 5, joining materials 6, a case member 7, an electrode terminal 8, an adhesive 9, a base plate 10, bonding wires 11 which are line members, and a filling member 12. Moreover, case member 7 includes angled surface 71 over the entire bottom surface.

In FIG. 22, the portion between the inner periphery and the outer periphery of case member 7 is angled surface 71 of case member 7. Moreover, the dotted line represents the outer periphery (the peripheral edge) of base plate 10.

In FIGS. 23, 24, angled surface 71 of case member 7 is provided from the inner periphery portion side to the outer periphery portion side (over the entire surface) of the bottom surface of case member 7, and the inner periphery portion side of the bottom surface of case member 7 is in contact with the top surface of base plate 10.

Next, a method for fabricating power module 500 configured as set forth above, according to Embodiment 5, will be described.

Basically, power module 500 can be fabricated through the steps illustrated in FIG. 4 to FIG. 11 illustrated with reference to Embodiment 1. However, Embodiment 1 has been described that the step illustrated in FIG. 12 may be employed, instead of FIG. 7. Embodiment 5 is the same as Embodiment 1, except for filling the adhesive 9 obliquely, rather than from the bottom surface side of case member 7 as illustrated in FIG. 12.

Figure 25:
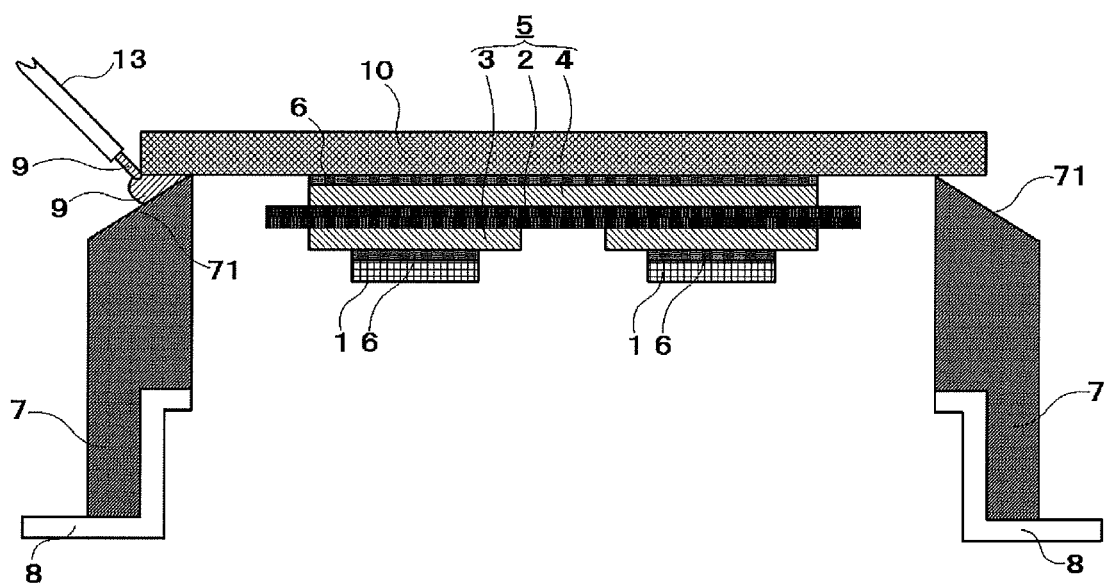
FIG. 25 is a cross-sectional structural diagram illustrating another steps of fabricating the power module according to Embodiment 5 of the present invention.

FIG. 25 is a cross-sectional structural diagram showing another steps of fabricating, the power module according to Embodiment 5 of the present invention. In the above-described steps of fabricating power module 100, when adhering case member 7 and base plate 10 using adhesive 9 as shown in FIG. 12, case member 7 and base plate 10 can be adhered while case member 7 is disposed with the bottom surface up and base plate 10 is disposed on case member 7, as shown in FIG. 25.

More specifically, as shown in FIG. 25, case member 7 is disposed with the bottom surface up. After case member 7 is disposed, base plate 10 is disposed on case member 7 so that the vertex portion of the inner periphery side of angled surface 71 of case member 7 is in contact with base plate 10. After base plate 10 is disposed on case member 7, adhesive 9 is filled in the region bounded by angled surface 71 of case member 7 and base plate 10 using dispenser 13 (adhesive member filling step). After adhesive 9 is filled, adhesive 9 is hardened, thereby adhering case member 7 and base plate 10 (case member adhering step). In this case, adhesive 9 can be suppressed from dropping from angled surface 71 of case member 7 by adhesive 9 having a viscosity higher than usual.

Then, power module 500 can be fabricated through the steps illustrated in FIGS. 9 to 11.

In power module 500 configured as the above, since the bottom surface of case member 7 is provided with angled surface 71 from the inner periphery portion side to the outer periphery portion side of case member 7, and case member 7 is disposed so that the inner periphery portion side of the bottom surface of case member 7 is in contact with the top surface of base plate 10, filling member 12 and adhesive 9 can be separated without contacting with each other, thereby inhibiting filling member 12 and adhesive 9 from being disjoined.

Moreover, since the bottom surface of case member 7 is provided with angled surface 71, and case member 7 is disposed so that the inner periphery portion side of the bottom surface of case member 7 is in contact with the top surface of base plate 10, electrical insulation properties improve, thereby improving the reliability of the power module.

Furthermore, since the bottom surface of case member 7 is provided with angled surface 71 from the inner periphery portion side to the outer periphery portion side, adhesive 9 is facilitated to flow to the outer periphery side of case member 7, while eliminating the contact between filling member 12 and adhesive 9, thereby allowing case member 7 and base plate 10 to be uniformly adhered.

Moreover, since the bottom surface of case member 7 is provided with angled surface 71, the contact area between case member 7 and base plate 10 is increased, thereby improving the adhesion strength between case member 7 and base plate 10.

Furthermore, since the bottom surface of case member 7 is provided with angled surface 71 and case member 7 is disposed so that the inner periphery portion side of the bottom surface of case member 7 is in contact with the top surface of base plate 10, one can select the material of adhesive 9 and the material of filling member 12, independent of each other, allowing an expanded degree of freedom to be provided with respect to selection of material.

Embodiment 6

Embodiment 6 is a power conversion device having the power module according to the above-described Embodiments 1 to 5 applied thereto. While the present invention is not limited to a particular power conversion device, the present invention applied to a three-phase inverter will be described in the following as Embodiment 6.

Figure 26:
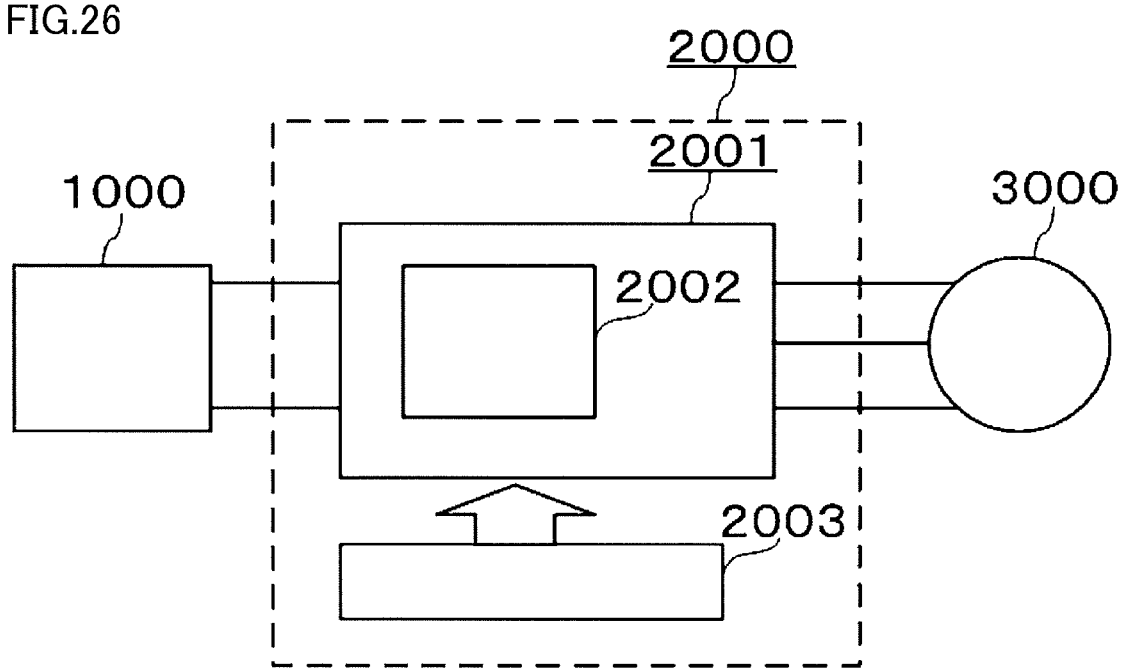
FIG. 26 is a block diagram showing a configuration of a power conversion system having a power conversion device according to Embodiment 6 of the present invention is applied thereto.

FIG. 26 is a block diagram showing a configuration of a power conversion system having the power conversion device according to Embodiment 6 of the present invention applied thereto.

The power conversion system, shown in FIG. 26, includes a power supply 1000, a power conversion device 2000, and a load 3000. Power supply 1000 is a direct-current (DC) power supply, and supplies power conversion device 2000 with DC power. Power supply 1000 can be configured of various components. Power supply 1000 can be configured of, for example, a DC system, a solar cell, or a storage battery, or may be configured of a rectifier circuit connected to an alternating-current (AC) system, or an AC-to-DC converter. Alternatively, power supply 1000 may be configured of a DC-to-DC converter which converts DC power output from a DC system into given power.

Power conversion device 2000 is a three-phase inverter connected between power supply 1000 and load 3000. Power conversion device 2000 converts the DC power, supplied from power supply 1000, into AC power, and supplies the AC power to load 3000. As shown in FIG. 26, power conversion device 2000 includes: a main converter circuit 2001 which converts DC power, input from power supply 1000, into AC power and outputs the AC power; and a control circuit 2003 which outputs to main converter circuit 2001 a control signal which controls main converter circuit 2001.

Load 3000 is a three-phase motor which is driven by the AC power supplied from power conversion device 2000. Note that load 3000 is not limited to a particular application. Load 3000 is a motor mounted on various electronic devices, and is used as a motor or the like for hybrid vehicles, electric vehicles, railroad wagons, elevators, or air conditioners, for example.

In the following, details of power conversion device 2000 will be described. Main converter circuit 2001 includes a switching element and a freewheeling diode (not shown) which are incorporated in power module 2002. The switching element switches, thereby main converter circuit 2001 converting the DC power, supplied from power supply 1000, into AC power and supplying the AC power to load 3000. While there are various specific circuit structures for main converter circuit 2001, main converter circuit 2001 according to the present embodiment can be a two-level, three-phase full-bridge circuit which includes six switching elements and six freewheeling diodes connected in anti-parallel with the six switching elements, respectively. Main converter circuit 2001 includes power module 2002 according to any of Embodiments 1 to 5 described above in which the switching elements, the freewheeling diodes, etc. are incorporated. Every two switching elements, among the six switching elements, are connected in series, forming upper and lower arms. The upper and lower arms form respective phases (U phase, V phase, W phase) of the full-bridge circuit. The output terminals of the upper and lower arms, that is, three output terminals of main converter circuit 2001 are connected to load 3000.

Moreover, main converter circuit 2001 includes a drive circuit (not shown) for driving the switching elements. The drive circuit may be incorporated in power module 2002, or may be separate from power module 2002. The drive circuit generates drive signals for driving the switching elements included in main converter circuit 2001, and supplies the drive signals to control electrodes included in the switching elements of main converter circuit 2001. Specifically, according to a control signal from control circuit 2003 described below, the drive circuit outputs to the control electrode included in each switching element a drive signal for bringing the switching element into an on-state, and a drive signal for bringing the switching element into an off-state. In order to maintain the switching element in the on-state, the drive signal is a voltage signal (an on-signal) greater than or equal to a threshold voltage for the switching element. In order to maintain the switching element in the off-state, the drive signal is a voltage signal (an off-signal) less than to the threshold voltage of the switching element.

Control circuit 2003 controls the switching elements included in main converter circuit 2001 so that desired power is supplied to load 3000. Specifically, based on power to be supplied to load 3000, control circuit 2003 calculates a time (the on-time) at which each switching element, included in main converter circuit 2001, is to be in the on-state. For example, control circuit 2003 can control main converter circuit 2001 by PWM control in which the on-time of the switching element is modulated according to a voltage to be output. Moreover, control circuit 2003 outputs a control command (the control signal) to the drive circuit included in main converter circuit 2001 so that, at each time point, an on-signal is output to a switching element to be in the on-state and an off-signal is output to a switching element to be in the off-state. According to the control signal, the drive circuit outputs an on-signal or an off-signal as a drive signal to the control electrode included in each switching element.

In the power conversion device according to Embodiment 6 as configured above, the power module according to Embodiments 1 to 5 is applied as power module 2002 for main converter circuit 2001, thereby achieving improved reliability.

While the present embodiment has been described with reference to applying the present invention to a two-level, three-phase inverter, the present invention is not limited thereto, and applicable to various power conversion devices. While the present embodiment has been described with reference to a two-level power conversion device, the present invention may be a three-level, multi-level power conversion device, and may be applied to a single-phase inverter in the case where power is supplied to a single-phase load. Moreover, in the case where power is supplied to a DC load, etc., the present invention is can be applied also to a DC-to-DC converter, an AC-to-DC converter, etc.

Moreover, the power conversion device having the present invention applied thereto is not limited to the case where the above-mentioned load is a motor, and may be used as, for example, an electrical discharge machine, a laser machine, an induction cooking appliance, a power supply for a non-contact power supply system, etc., and further, may be used as a power conditioner for a solar power system, a storage system, etc.

Examples

In the following, details of the present invention will be described with reference to Examples and Comparative Example. However, the present invention is not limited thereto.

Using samples (power modules) for evaluation of structures corresponding to Embodiments 1 to 5 and a comparative structure, failure mode and life testing with varying shapes of case member 7 were performed.

The basic structure of the power modules used for evaluation is as follows.

An Si semiconductor element is used as semiconductor element 1. Si semiconductor element 1 is joined to insulative substrate 5 at a given position on the top surface of insulative substrate 5 via solder 6.

Specifications of insulative substrate 5 includes copper patterns, which are metal layers 3, 4 having a thickness of 0.7 mm, formed on opposite surfaces of a $Si_3N_4$ ceramic plate 2 having a thickness of 0.32 mm. Here, metal layers 3, 4 are smaller in size than ceramic plate 2, and do not extend beyond the ceramic plate 2.

Using a solder 6, base plate 10 is joined to the rear surface of insulative substrate 5 having Si semiconductor element 1 joined thereto. Case member 7 is adhered, by adhesive 9, to the outer periphery of base plate 10 in a manner surrounding insulative substrate 5. As processing conditions for hardening adhesive 9, adhesive 9 was heated at 120 degrees Celsius for two hours.

Case member 7 is produced by insert molding. A PPS resin is used as a material of the case member. A silicone adhesive is used as adhesive 9 to adhere case member 7 and base plate 10. Electrode terminal 8 is formed on case member 7. Electrode terminal 8 and semiconductor elements 1 are electrically connected by bonding wires 11. Metal layers 3 having the copper pattern formed thereon are also joined at given positions by bonding wires 11.

After the connection by bonding wires 11, the region bounded by case member 7 and base plate 10 is filled with filling member 12 to seal bonding wire 11, the filling member 12 being an epoxy resin (a liquid sealing resin) which is loaded with 50 vol % of a silica filler and whose coefficient of linear expansion is 20 ppm/K. After the epoxy resin is filled, and the epoxy resin is heated at 150 degrees Celsius for two hours, and an evaluation sample was produced.

Figure 27:
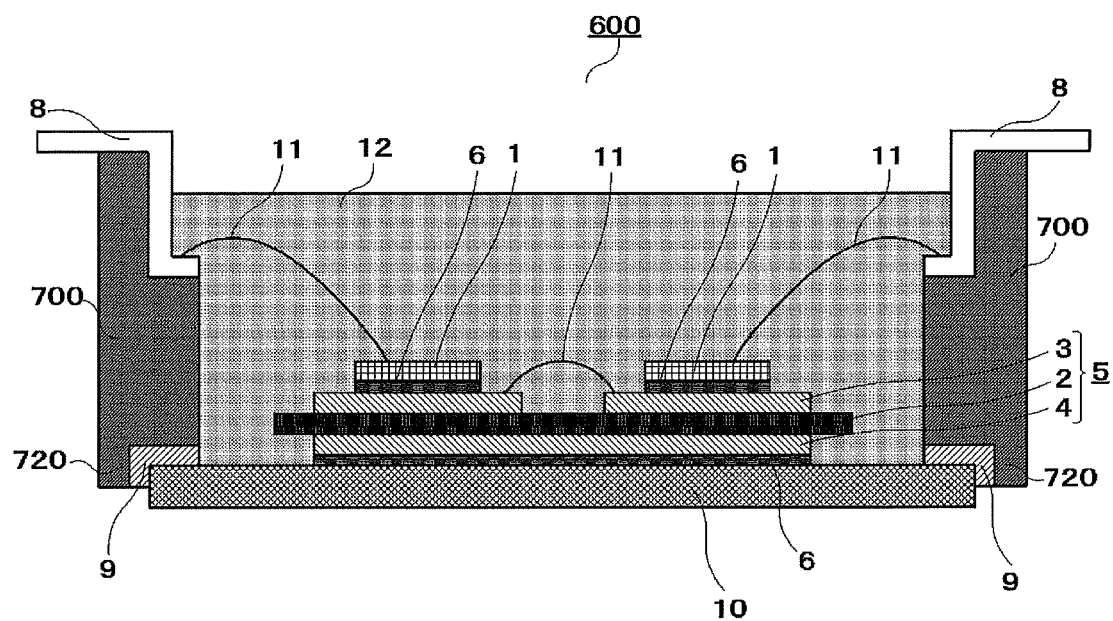
FIG. 27 is a cross-sectional structural diagram of a power module according to Comparative Example of the present invention.

FIG. 27 is a cross-sectional structural diagram of the power module according to Comparative Example of the present invention. In the figure, base plate 10 and case member 700 including protrusion 720 are adhered using adhesive 9. Adhesive 9 and filling member 12 are in contact at the adhered location between case member 700 and base plate 10. Comparative Example has the same configuration as the above description, except for the shape of case member 700. For convenience, it should be noted that the same part numbers as those in the embodiments are used in FIG. 27 showing Comparative Example (except for case member 7).

Table 1 shows specifications (shapes of the case members) of the prototyped power modules, failure modes, and life testing results.

TABLE 1

|  |  | Ex. 1 | Ex. 2 | Ex. 3 | Ex. 4 | Ex. 5 | Comparative Example |
|---|---|---|---|---|---|---|---|
| Heat cycle 1st conditions (−40 to 125° C.) | Life testing | ○ | ○ | ○ | ○ | ○ | Δ |
|  | Failure mode | — | — | — | — | — | Dejoined |
| Heat cycle 2nd conditions (−40 to 150° C.) | Life testing | ○ | ○ | ○ | ○ | ○ | x |
|  | Failure mode | — | — | — | — | — | Dejoined |

Various heat cycle tests were conducted on the evaluation samples.

Several number of evaluation samples were prototyped for Examples 1 to 5 and Comparative Example. The prototyped power module was placed in a constant temperature bath which can control the temperature of the enter power module, and a heat cycle test was performed. During the heat cycle test, the temperature of the constant temperature bath was adjusted and multiple evaluation samples were evaluated.

The heat cycle test was performed under two types of conditions with different temperatures for the constant temperature bath at a high temperature. The first conditions for the heat cycle test are that the evaluation sample was held for 30 minutes at −40 degrees Celsius and then held for 30 minutes at 125 degrees Celsius as one cycle (−40 degrees Celsius to 125 degrees Celsius). The process was repeated for 500 cycles. The second conditions for the heat cycle test are that the evaluation sample was held for 30 minutes at −40 degrees Celsius and then held for 30 minutes at 150 degrees Celsius as one cycle (−40 degrees Celsius to 150 degrees Celsius). The process was repeated for 500 cycles.

During the heat cycle test, continuity testing was conducted for every 50 cycles. When a fault was found during the continuity testing, a primary cause of the malfunction was examined through nondestructive disjoin observations by an ultrasonic imaging device, FineSAT (manufactured by Hitachi Engineering & Service Co., Ltd.), and cross-section observations by a scanning electron microscope. Finally, the evaluation samples were examined in the same manner even after the 500 cycles to make sure that they were structurally sound.

Table 1 shows the specifications (shapes of the case members) of the prototyped power modules, the failure mode, and life testing results. In each of the evaluations, three power modules were evaluated. In Table 1, "○" indicates that all the three power modules passed the continuity testing (life testing) after 500 heat cycle tests, "Δ" indicates that one or two power modules passed, and "x" indicates that none of the power modules passed the continuity testing (life testing) after 500 heat cycle tests. The structure analysis results ("Disjoined" etc.) of the evaluation samples which are poorly conductive are shown in the failure mode. The symbol "-" indicates no fault.

Comparative Example

Initially, results of the evaluation of the evaluation sample according to Comparative Example of the present invention will be described. In the evaluation by the testing under the first conditions (−40 degrees Celsius to 125 degrees Celsius), one sample became poorly conductive after 500 cycles. For this reason, "Δ" was described in the life testing. In the evaluation by the testing under the second conditions (−40 degrees Celsius to 150 degrees Celsius), three samples became poorly conductive after 100 cycles. For this reason, "x" was described in the life testing. The structure analysis performed after the life testing reveals that the failure mode for any of the poorly conductive samples was "Disjoined." In other words, it is found that, according to the evaluation sample of Comparative Example, power module 600 may be seen to become poorly conductive under the first conditions, and that, with the current structure, it is difficult to avoid a malfunction of the power module under the second conditions (see Table 1).

A silicone adhesive was used as adhesive 9, and an epoxy resin was used as filling member 12. As shown in FIG. 27, the silicone adhesive and the epoxy resin that are adhering case member 700 and base plate 10 are in contact at the adhered location between case member 700 and base plate 10. As a result, if the power module is used under the environment that is subjected to extreme temperature changes like the evaluation conditions of this testing, the epoxy resin cracks and disjoins due to a thermal stress caused by the difference in coefficient of linear expansion between the silicone adhesive and the epoxy resin, or due to poor familiarity attributed to the polarity difference between the silicone adhesive and the epoxy resin. The cracks and disjoin develop at the interface between base plate 10 and the epoxy resin, and further reach semiconductor element 1, thereby causing poor insulation. Due to this, the reliability of the power module deteriorates.

Example 1

Next, results of the evaluation of the evaluation sample according to Embodiment 1 will be described. In Embodiment 1, the portion of the bottom surface of case member 7 includes angled surface 71 (tapered), the portion being overlapping with the top surface of base plate 10 in plan view and at which the inner periphery side of case member 7, which is in contact with filling member 12, is in contact with the top surface of base plate 10 in cross-sectional view. Due to this, the silicone adhesive and the epoxy resin do not contact with each other.

It was found that, in the evaluation by the testing under the first conditions (−40 degrees Celsius to 125 degrees Celsius), the three sample power modules 100 did not become poorly conductive even after the 500 cycles, and successfully operated. For this reason, "○" was described in the life testing. It was found that, in the evaluation by the testing under the second conditions (−40 degrees Celsius to 150 degrees Celsius) also, the three sample power modules 100 did not become poorly conductive after the 500 cycles, and successfully operated. For this reason, "○" was described in the life testing. Moreover, no fault was observed in any of the evaluation samples from the structure analysis performed after the life testing. Thus, "-" was described in the failure mode (see Table 1).

Example 2

Next, results of the evaluation of the evaluation sample according to Embodiment 2 will be described. In Embodiment 2, the portion of the bottom surface of case member 7 includes angled surface 71 (tapered), the portion being overlapping with the top surface of base plate 10 in plan view and at which the inner periphery side of case member 7, which is in contact with filling member 12, is in contact with the top surface of base plate 10 in cross-sectional view. Moreover, the inner periphery side of case member 7 includes flat portion 73 which is in contact with the top surface of base plate 10. Due to this, the silicone adhesive (adhesive 9) and the epoxy resin (filling member 12) do not contact with each other.

It was found that, in the evaluation by the testing under the first conditions (−40 degrees Celsius to 125 degrees Celsius), the three sample power modules 200 did not become poorly conductive even after the 500 cycles, and successfully operated. For this reason, "○" was described in the life testing. It was found that, in the evaluation by the testing under the second conditions (−40 degrees Celsius to 150 degrees Celsius) also, the three sample power modules 200 did not become poorly conductive after the 500 cycles, and successfully operated. For this reason, "○" was described in the life testing. Moreover, no fault was observed in any of the evaluation samples from the structure analysis performed after the life testing. Thus, "-" was described in the failure mode (see Table 1).

Example 3

Next, results of the evaluation of the evaluation sample according to Embodiment 3 will be described. In Embodiment 3, the portion of the bottom surface of case member 7 includes angled surface 71 (tapered), the portion being overlapping with the top surface of base plate 10 in plan view and at which the inner periphery side of case member 7, which is in contact with filling member 12, is in contact with the top surface of base plate 10 in cross-sectional view. Moreover, the inner periphery side of protrusion 72 of case member 7 includes second angled surface 74 whose distance to the side surface of base plate 10 increases toward the rear surface side of base plate 10. Due to this, the silicone adhesive and the epoxy resin do not contact with each other.

It was found that, in the evaluation by the testing under the first conditions (−40 degrees Celsius to 125 degrees Celsius), the three sample power modules 400 did not become poorly conductive even after the 500 cycles, and successfully operated. For this reason, "○" was described in the life testing. It was found that, in the evaluation by the testing under the second conditions (−40 degrees Celsius to 150 degrees Celsius) also, the three sample power modules 400 did not become poorly conductive after the 500 cycles, and successfully operated. For this reason, "○" was described in the life testing. Moreover, no fault was observed in any of the evaluation samples from the structure analysis performed after the life testing. Thus, "-" was described in the failure mode (see Table 1).

Example 4

Next, results of the evaluation of the evaluation sample according to Embodiment 4 will be described. In Embodiment 4, the portion of the bottom surface of case member 7 includes angled surface 71 (tapered), the portion being overlapping with the top surface of base plate 10 in plan view and at which the inner periphery side of case member 7, which is in contact with filling member 12, is in contact with the top surface of base plate 10 in cross-sectional view. Moreover, the inner periphery side of case member 7 includes fitting portion 75 fitted into recess 76 in the top surface of base plate 10. Due to this, the silicone adhesive and the epoxy resin do not contact with each other.

It was found that, in the evaluation by the testing under the first conditions (−40 degrees Celsius to 125 degrees Celsius), the three sample power modules 400 did not become poorly conductive even after the 500 cycles, and successfully operated. For this reason, "○" was described in the life testing. It was found that, in the evaluation by the testing under the second conditions (−40 degrees Celsius to 150 degrees Celsius) also, the three sample power modules 400 did not become poorly conductive after the 500 cycles, and successfully operated. For this reason, "○" was described in the life testing. Moreover, no fault was observed in any of the evaluation samples from the structure analysis performed after the life testing. Thus, "-" was described in the failure mode (see Table 1).

Example 5

Next, results of the evaluation of the evaluation sample according to Embodiment 5 will be described. In Embodiment 5, the portion of the bottom surface of case member 7 includes angled surface 71 (tapered), the portion being overlapping with the top surface of base plate 10 in plan view and at which the inner periphery side of case member 7, which is in contact with filling member 12, is in contact with the top surface of base plate 10 in cross-sectional view. In Embodiment 5, angled surface 71 is formed over the bottom surface of case member 7 from the inner periphery portion side to the outer periphery portion side (over the entire surface) of the case member. Due to this, the silicone adhesive and the epoxy resin do not contact with each other.

It was found that, in the evaluation by the testing under the first conditions (−40 degrees Celsius to 125 degrees Celsius), the three sample power modules 500 did not become poorly conductive even after the 500 cycles, and successfully operated. For this reason, "o" was described in the life testing. It was found that, in the evaluation by the testing under the second conditions (−40 degrees Celsius to 150 degrees Celsius) also, the three sample power modules 500 did not become poorly conductive after the 500 cycles, and successfully operated. For this reason, "○" was described in the life testing. Moreover, no fault was observed in any of the evaluation samples from the structure analysis performed after the life testing. Thus, "-" was described in the failure mode (see Table 1).

From these evaluation results, the bottom surface of case member 7 on the inner periphery side is brought into contact with the top surface of base plate 10 and a point of contact between the silicone adhesive (adhesive 9) and the epoxy resin (filling member 12) is eliminated, thereby providing a highly reliable power module which causes no disjoin during the heat cycle test.

In particular, if SiC is used as semiconductor element 1, the power semiconductor element is operated at a higher temperature than the case of Si, in order to take advantage of the characteristics of SiC. The power module equipped with a SiC device is required to have a higher reliability. Thus, the benefits of the present invention that a highly reliable power module is implemented, is more effective.

The above-described embodiments should be understood in all aspects as illustrative and not restrictive. The scope of the present invention is indicated by the appended claims, rather than by the scopes of the above-described embodiments, and all changes that come within the scope of the claims and the meaning and range of equivalency of the claims are intended to be embraced within their scope. Moreover, the invention may be formed by combining multiple components disclosed in the above-described embodiments as appropriate.

REFERENCE SIGNS LIST 1 semiconductor element; 2 ceramic plate; 3, 4 metal layer; 5 insulative substrate; 6 joining material; 7, 700 case member; 8 electrode terminal; 9 adhesive; 10 base plate; 11 bonding wire; 12 filling member; 13 dispenser; 71 angled surface; 72, 720 protrusion; 73 flat portion; 74 second angled surface; 75 fitting portion; 76 recess; 100, 200, 300, 400, 410, 500, 600, 2002 power module; 1000 power supply; 2000 power conversion device; 2001 main converter circuit; 2003 control circuit; and 3000 load.

The invention claimed is:
1. A power module, comprising:
an insulative substrate having a semiconductor element mounted on a top surface;
a base plate having a flat plate shape joined to a rear surface of the insulative substrate;
a case member that surrounds the insulative substrate, the case member having a bottom surface whose inner periphery portion side is in contact with a top surface of the base plate, the bottom surface being provided with an angled portion whose distance to the top surface of the base plate increases toward an outer periphery side of the base plate;
an adhesive member that fills a space between the base plate and the angled portion to adhere the base plate and the case member; and
a filling member that fills a region bounded by the base plate and the case member.
2. The power module according to claim 1, wherein the bottom surface includes a protrusion provided outwardly of the angled portion and protruding to a base plate side.
3. The power module according to claim 2, wherein the bottom surface includes a flat portion positioned inwardly of the angled portion, the flat portion being in contact with the base plate.
4. The power module according to claim 2, wherein a distance from the protrusion to a side surface of the base plate increases toward a rear surface side of the base plate.
5. The power module according to claim 1, wherein the inner periphery portion side of the bottom surface is provided with a fitting portion fitted into the base plate.
6. The power module according to claim 1, wherein the angled portion is formed over an entirety of the bottom surface.
7. A method for fabricating a power module, the method comprising:
a semiconductor element join step of joining a semiconductor element to a top surface of an insulative substrate by a joining material;
an insulative substrate join step of joining a rear surface of the insulative substrate and a base plate having a flat plate shape by a joining material;
a case member adhering step of adhering the base plate and a case member using an adhesive member that fills a space between an angled surface and the base plate, the case member with the base plate, surrounding the insulative substrate, the case member having a bottom surface whose inner periphery portion side is in contact with a top surface of the base plate, the bottom surface being provided with the angled surface whose distance to the top surface of the base plate increases toward an outer periphery side of the base plate; and
a filling member filling step of filling a region bounded by the base plate and the case member with a filling member.
8. The method for fabricating the power module according to claim 7, wherein
the case member adhering step includes an adhesive member filling step of disposing the base plate and the case member with the bottom surface of the case member up and the bottom surface and the top surface of the base plate in contact with each other, and filling a region, bounded by the angled surface and the base plate, with the adhesive member.
9. A power conversion device, comprising:
a main converter circuit that includes the power module according to claim 1, and is configured to convert input power into output power, and a control circuit that outputs to the main converter circuit a control signal which controls the main converter circuit.

10. A power module, comprising:

an insulative substrate having a semiconductor element joined to a top surface;

a base plate joined to a rear surface of the insulative substrate;

a case member with the base plate, that surrounds the insulative substrate, the case member having a bottom surface whose inner periphery portion side is in contact with a top surface of the base plate, the bottom surface being provided with an angled surface whose distance to the top surface of the base plate increases toward an outer periphery side of the base plate, and a protrusion protruding beyond the angled surface to a base plate side and having an inner periphery side whose distance to a side surface of the base plate increases toward a rear surface side of the base plate;

an adhesive member fills a space between the base plate and the angled surface to adhere the base plate and the case member; and a filling member fills a region bounded by the base plate and the case member.

* * * * *